United States Patent [19]
Kumagai

[11] Patent Number: 6,037,617
[45] Date of Patent: Mar. 14, 2000

[54] SOI IGFETS HAVING RAISED INTEGRATION LEVEL

[75] Inventor: Kouichi Kumagai, Tokyo, Japan

[73] Assignee: NEC Corporation, Tokyo, Japan

[21] Appl. No.: 09/018,052

[22] Filed: Feb. 3, 1998

[30] Foreign Application Priority Data

Feb. 3, 1997 [JP] Japan .................................. 9-020421

[51] Int. Cl.[7] .................................................. H01L 27/12
[52] U.S. Cl. .......................................... 257/262; 438/154
[58] Field of Search .................................. 251/347, 350, 251/351, 72; 438/154

[56] References Cited

U.S. PATENT DOCUMENTS

| | | | |
|---|---|---|---|
| 5,061,983 | 10/1991 | Egawa et al. ............................ | 357/59 |
| 5,359,219 | 10/1994 | Hwang ..................................... | 257/351 |
| 5,510,636 | 4/1996 | Murata ..................................... | 257/206 |
| 5,587,597 | 12/1996 | Reedy et al. ............................ | 257/351 |
| 5,614,433 | 3/1997 | Mandelman ............................. | 437/57 |
| 5,635,744 | 6/1997 | Hidaka et al. .......................... | 257/351 |
| 5,739,549 | 4/1998 | Takemura et al. ...................... | 357/72 |

FOREIGN PATENT DOCUMENTS

| | | |
|---|---|---|
| 62-81055 | 4/1987 | Japan . |
| 62-190751 | 8/1987 | Japan . |
| 64-15981 | 1/1989 | Japan . |
| 316174 | 1/1991 | Japan . |
| 6140630 | 5/1994 | Japan . |
| 8-148579 | 6/1996 | Japan . |

OTHER PUBLICATIONS

Jon M. Stern et al, "Silicon–on–Insulator (SOI): A High Performance ASIC Technology", IEEE 1992 Custom Integrated Circuits Conference, pp. 9.2.1–9.2.4.

*Primary Examiner*—David B. Hardy
*Attorney, Agent, or Firm*—Sughrue, Mion, Zinn, Macpeak & Seas, PLLC

[57] ABSTRACT

A semiconductor integrated circuit device with the SOI structure is provided, which decreases the chip area of wiring lines interconnecting p- and n-channel IGFETs, raising their integration level. This device is comprised of a semiconductor layer formed on an insulating substrate. The semiconductor layer has a first area extending along a first direction and a second area extending along the first direction. The first and second areas are adjacent to one another. A first IGFET of a first conductivity type is formed in the first area of the semiconductor layer. A second IGFET of a second conductivity type opposite to the first conductivity type is formed in the first area of the semiconductor layer. One of a pair of source/drain regions of the second IGFET is electrically connected to one of a pair of source/drain regions of the first IGFET by a first interconnection diffusion region. A third IGFET of the first conductivity type is formed in the second area of the semiconductor layer. One of a pair of source/drain regions of the third IGFET is electrically connected to one of the pair of source/drain regions of the second IGFET by a second interconnection diffusion region.

10 Claims, 17 Drawing Sheets

SOI IGFETS HAVING RAISED INTEGRATION LEVEL

BACKGROUND OF THE INVENTION

1. Field of the Invention

The present invention relates to a semiconductor integrated circuit device and more particularly, to a semiconductor integrated circuit device including n- and p-channel Insulated-Gate Field-Effect Transistors (IGFETs) laid out on a so-called Silicon-On-Insulator (SOI) substrate, which raises the integration level of electronic elements.

2. Description of the Prior Art

A Complementary Metal-Oxide-Semiconductor (CMOS) Sea-Of-Gates (SOG) array is a typical one of well-known Application Specific Integrated Circuits (ASICs)

FIG. 1 shows a conventional layout of a CMOS SOG array, which includes a logic block of a two-input NAND circuit shown in FIG. 19. FIGS. 2 and 3 show cross-sections along the lines II—II and III—III in FIG. 1, respectively.

In FIG. 1, four basic cells 1203 are horizontally aligned so that adjoining two ones of the cells 1203 have overlapped or commonly-used boundaries. Any one of the four cells 1203 forms a mirror image of another adjacent thereto. Although this layout includes a lot of basic cells in addition to the four basic cells 1203, they are not shown here for the sake of simplification.

A first rectangular area 1201 and a second rectangular area 1202 are separately formed and electrically isolated by an isolation area 1200 located between these areas 1201 and 1202. The first area 1201 includes p-channel MOSFETs horizontally aligned along the longitudinal axis of the area 1201. The second area 1202 includes n-channel MOSFETs horizontally aligned along the longitudinal axis of the area 1202.

In each of the basic cells 1203, three $p^+$-type rectangular diffusion regions (i.e., source/drain regions for the p-channel MOSFETs) are formed to be aligned horizontally in the first area 1201. Three $n^+$-type rectangular diffusion regions (i.e., source/drain regions for the n-channel MOSFETs) are formed to be aligned horizontally in the second area 1202. Two linear polysilicon gate electrodes are formed to be aligned vertically to be overlapped with the first and second areas 1201 and 1202. An inner half of an $n^+$-type rectangular contact region is formed to be aligned to the $p^+$-type diffusion regions. A $p^+$-type inner half of a rectangular contact region is formed to be aligned to the $n^+$-type diffusion regions. These two contact regions are located to be overlapped with the common boundary of the adjacent basic cells 1203.

In FIGS. 1, 2, and 3, only a second one of the basic cells 1203, which is next to a first one located at the left-hand-side end, is used for constituting a two-input NAND circuit shown in FIG. 19.

In the second one of the basic cells 1203, the $p^+$-type source/drain regions 1206a and 1206b and the corresponding gate electrode 1208a constitute one of the p-channel MOSFETs formed in the first area 1201. The $p^+$-type source/drain regions 1206b and 1206c and the corresponding gate electrode 1208b constitute another of the p-channel MOSFETs formed in the first area 1201. These two p-channel MOSFETs are electrically connected to each other by commonly using the source/drain regions 1206b.

Similarly, the $n^+$-type source/drain regions 1207a and 1207b and the corresponding gate electrode 1208a constitute one of the n-channel MOSFETs formed in the second area 1202. The $n^+$-type source/drain regions 1207b and 1207c and the corresponding gate electrode 1208b constitute another of the n-channel MOSFETs formed in the second area 1202. These two n-channel MOSFETs are electrically connected to each other by commonly using the source/drain regions 1207b.

In a third one of the cells 1203, the $p^+$-type source/drain regions 1206d and 1206e and the corresponding gate electrode 1208c constitute one of the p-channel MOSFETs formed in the first area 1201. The $p^+$-type source/drain regions 1206e and 1206f and the corresponding gate electrode 1208d constitute another of the p-channel MOSFETs formed in the first area 1201. These two p-channel MOSFETs are electrically connected to each other by commonly using the source/drain regions 1206e.

Similarly, the $n^+$-type source/drain regions 1207d and 1207e and the corresponding gate electrode 1208c constitute one of the n-channel MOSFETs formed in the second area 1202. The $n^+$-type source/drain regions 1207e and 1207f and the corresponding gate electrode 1208d constitute another of the n-channel MOSFETs formed in the second area 1202. These two n-channel MOSFETs are electrically connected to each other by commonly using the source/drain regions 1207e.

In a fourth one of the cells 1203, the $p^+$-type source/drain regions 1206g and 1206h and the corresponding gate electrode 1208e constitute one of the p-channel MOSFETs formed in the first area 1201. The $p^+$-type source/drain regions 1206h and 1206i and the corresponding gate electrode 1208f constitute another of the p-channel MOSFETs formed in the first area 1201. These two p-channel MOSFETs are electrically connected to each other by commonly using the source/drain regions 1206h.

Similarly, the $n^+$-type source/drain regions 1207g and 1207h and the corresponding gate electrode 1208e constitute one of the n-channel MOSFETs formed in the second area 1202. The $n^+$-type source/drain regions 1207h and 1207i and the corresponding gate electrode 1208f constitute another of the n-channel MOSFETs formed in the second area 1202. These two n-channel MOSFETs are electrically connected to each other by commonly using the source/drain regions 1207h.

At the common boundary of the first and second ones of the basic cells 1203, the $n^+$-type contact region 1204a and the $p^+$-type contact region 1205a are formed in the first and second areas 1201 and 1202, respectively.

A linear power supply line 1211 for supplying a power supply voltage or potential $V_{DD}$ is formed over the first region 1201 to extend horizontally along the longitudinal axis of the first area 1201. The power supply line 1211 is electrically connected to the $p^+$-type source/drain regions 1206a and 1206c and the $n^+$-type contact regions 1204a and 1204b through corresponding contact holes 1210.

A linear ground line 1212 for supplying a ground voltage or potential is formed over the second area 1202 to extend horizontally along the longitudinal axis of the second area 1202, where the ground line 1212 is parallel to the power supply line 1211. The ground line 1212 is electrically connected to the $n^+$-type diffusion region 1207c and the $p^+$-type contact regions 1205a and 1205b through corresponding contact holes 1210.

A metal wiring line 1213 is connected to the polysilicon gate electrode 1208a through the corresponding contact hole 1210. The wiring line 1213 is electrically connected to a first input terminal (not shown) of the two-input NAND circuit in FIG. 19, to which a first input signal A01 is applied.

A metal wiring line 1214 is connected to the polysilicon gate electrode 1208b through the corresponding contact hole 1210. The wiring line 1214 is electrically connected to a second input terminal (not shown) of the two-input NAND circuit in FIG. 19, to which a second input signal A02 is applied.

A metal wiring line 1215 is connected to the p$^+$-type source/drain region 1206b and the n$^+$-type source/drain region 1207a through the corresponding contact holes 1210, respectively. The wiring line 1215 is electrically connected to an output terminal (not shown) of the two-input NAND circuit in FIG. 19, from which an output signal X is derived.

As shown in FIGS. 2 and 3, an n-type well 1302 and a p-type well 1303 are formed in the surface area of a p-type single-crystal silicon substrate 303. The first area 1201, in which the p-channel MOSFETs are formed, is located in the n-type well 1302. The second area 1202, in which the n-channel MOSFETs are formed, is located in the p-type well 1303.

The power supply voltage or potential $V_{DD}$ is applied to the n-type well 1302 through the n$^+$-type contact regions 1204a and 1204b. The ground voltage or potential is applied to the p-type well 1303 through the p$^+$-type contact regions 1205a and 1205b.

Each of the basic cells 1203 is electrically isolated by an isolation oxide 1601 formed on the surface of the substrate 303. Each of the contact regions 1204a, 1204b, 1205a, and 1205b is isolated by the isolation oxide 1601.

As clearly shown in FIGS. 2 and 3, to decrease the electric resistance, the surface areas 1301 of each gate electrode, each source/drain region, and each contact region are made of silicide. In other words, the surfaces of each gate electrode, each source/drain region, and each contact region are covered with silicide layers 1301, respectively.

The reference numeral 1602 denotes a dielectric of each of the n- and p-channel MOSFETs. A lower part of the dielectric 1602 serves as a gate insulator and a pair of side parts thereof serve as sidewall spacers.

The reference numeral 1603 denotes an interlayer dielectric layer formed to cover the silicide layers 1301 and the uncovered dielectrics 1602 and the isolation oxide 1601. The power supply and ground lines 1211 and 1212 and the metal wiring lines 1213, 1214, and 1215 are located on the interlayer dielectric layer 1603.

With the above-described layout of the CMOS SOG array in FIGS. 1, 2, and 3 using a bulk semiconductor substrate, the isolation area 1200 needs to be formed between the first and second areas 1201 and 1202 (i.e., the n- and p-type wells 1302 and 1303) for the purpose of electrical isolation of the p- and n-type wells 1303 and 1302.

Also, since the power supply potential $V_{DD}$ is supplied to the p$^+$-type source/drain regions 1206a and 1206c through the corresponding contact holes 1210, the two p-channel MOSFETs using these regions 1206a and 1206c are parallel connected. The p$^+$-type diffusion regions 1206a and 1206c serve as source regions of the respective p-channel MOSFETs. The p$^+$-type diffusion regions 1206b serves as a common drain region for the p-channel MOSFETs.

Similarly, since the ground potential is supplied to the n$^+$-type source/drain region 1207c through the corresponding contact hole 1210, the n-channel MOSFET using the regions 1207c and 1207b is serially connected to the n-channel MOSFET using the n$^+$-type source/drain regions 1207a and 1207b. The n$^+$-type diffusion region 1207c serves as a source region of the corresponding n-channel MOSFET, the n$^+$-type diffusion region 1207a serves as a drain region of the corresponding n-channel. MOSFET, and the n$^+$-type diffusion region 1207b serves as source and drain regions of these two n-channel MOSFETs.

The p$^+$-type diffusion region 1206b is electrically connected to the n$^+$-type diffusion region 1207a by the metal wiring line 1215. The wiring lines 1213 and 1214 are electrically connected to the first and second input terminals of the two-input NAND circuit in FIG. 19, respectively.

Thus, the two-input NAND circuit is formed by using one of the basic cells 1203 in the conventional layout shown in FIGS. 1, 2, and 3. This is popular in an SOG array.

A two-input NOR circuit is often formed by using one of the basic cells 1203 instead of a two-input NAND circuit.

Like the conventional layout shown in FIGS. 1, 2, and 3, a typical basic cell of an SOG array has a layout of MOSFETs capable of implementation of a two-input NAND or two-input NOR circuit.

Also, in almost all of CMOS SOG arrays using a bulk semiconductor and standard cells, power supply and ground lines are arranged in parallel, and p- and n-channel MOSFETs are arranged along the power supply and ground lines. The p-channel MOSFETs are aligned in a row extending in parallel to the power supply and ground lines, and the n-channel MOSFETs are aligned in another row extending in parallel thereto. It is rare that the p- and n-channel MOSFETs are aligned in the same row. This is caused by the following reason.

To implement the p- and n-channel MOSFETs in the same row using the bulk CMOS technology, isolation regions are necessarily formed between adjoining MOSFETs. This degrades the integration level of the MOSFETs and other electronic elements in almost all CMOS circuits.

FIG. 4 shows another conventional layout of a CMOS SOG array, which includes a logic block of a 2-1 selector circuit shown in FIG. 6. This layout and its cross sections are the same as those in FIGS. 1, 2, and 3 except for the pattern of metal wiring lines and position of the contact holes. Therefore, the explanation about the same layout and configuration is omitted here for simplification of description by attaching the same reference symbols to the same or corresponding parts or members in FIG. 4.

In FIG. 4, the power supply line 1211 is electrically connected to the n$^+$-type contact regions 1204a and 1204b and the p$^+$-type source/drain regions 1206b and 1206h located in the first area 1201 through the corresponding contact holes 1210, respectively. The ground line 1212 is electrically connected to the p$^+$-type contact regions 1205a and 1205b and the n$^+$-type source/drain regions 1207b and 1207h located in the second area 1202 through the corresponding contact holes 1210, respectively.

A metal wiring line 1402 is formed to be connected to the polysilicon gate electrode 1208f through the corresponding contact hole 1210. The wiring line 1402 is electrically connected to a first input terminal (not shown) of the 2-1 selector circuit shown in FIG. 6, to which a first input signal A0 is applied.

A metal wiring line 1403 is formed to be connected to the polysilicon gate electrode 1208e through the corresponding contact hole 1210. The wiring line 1403 is electrically connected to a second input terminal (not shown) of the 2-1 selector circuit shown in FIG. 6, to which a second input signal B0 is applied.

A metal wiring line 1404 is formed to be connected to the polysilicon gate electrode 1208a through the corresponding contact hole 1210. The wiring line 1404 is electrically connected to a third input terminal (not shown) of the 2-1 selector circuit shown in FIG. 6, to which a select signal S is applied. The wiring line 1404 is further connected the polysilicon gate electrode 1208*d*.

A metal wiring line 1405 is formed to interconnect the p$^+$- and n$^+$-type type source/drain regions 1206*c* and 1207*c* through the corresponding contact holes 1210. The wiring line 1405 is electrically connected to an output terminal (not shown) of the 2-1 selector circuit shown in FIG. 6, from which an output signal X is derived.

A metal wiring line 1420 is formed to interconnect the p$^+$-type source/drain region 1206*i* and the n$^+$-type source/drain regions 1207*i* and 1207*d* through the corresponding contact holes 1210.

A metal wiring line 1421 is formed to interconnect the p$^+$-type source/drain regions 1206*d* and 1206*g* and the n$^+$-type source/drain regions 1207*g* and 1207*f* through the corresponding contact holes 1210.

A metal wiring line 1422 is formed to interconnect the p$^+$-type source/drain region 1206*e*, the n$^+$-type source/drain region 1207*e*, and the gate electrode 1208*b* through the corresponding contact holes 1210.

A metal wiring line 1423 is formed to interconnect the p$^+$-type source/drain region 1206*f* and the n$^+$-type source/drain region 1207*d* through the corresponding contact holes 1210.

A metal wiring line 1425 is formed to interconnect the p$^+$-type source/drain region 1206*a* and the n$^+$-type source/drain region 1207*a* through the corresponding contact holes 1210.

A metal wiring line 1424 is formed to interconnect the gate electrode 1208*c* and the wiring line 1425 through corresponding contact holes 1401. Thus, the gate electrode 1208*c* is electrically connected to the p$^+$-type source/drain region 1206*a* and the n$^+$-type source/drain region 1207*a* through the wiring lines 1424 and 1425.

Only the wiring line 1424 is located in a second wiring level, while the remaining wiring lines 1420, 1421, 1422, 1423, and 1425 and the power supply and ground lines 1211 and 1212 are located in a first wiring level. The first wiring level is located on the interlayer dielectric layer 1603 shown in FIGS. 2 and 3. The second wiring level is located over the first wiring level through another interlayer dielectric layer (not shown) formed on the interlayer dielectric layer 1603.

The p-channel MOSFET formed by the p$^+$-type source/drain regions 1206*h* and 1206*i* and the gate electrode 1208*f* and the n-channel MOSFET formed by the n$^+$-type source/drain regions 1207*h* and 1207*i* and the same gate electrode 1208*f* constitute an inverter 205*a* of the 2-1 selector circuit of FIG. 6.

The p-channel MOSFET formed by the p$^+$-type source/drain regions 1206*g* and 1206*h* and the gate electrode 1208*e* and the n-channel MOSFET formed by the n$^+$-type source/drain regions 1207*g* and 1207*h* and the same gate electrode 1208*e* constitute an inverter 205*b* of the 2-1 selector circuit of FIG. 6.

The p-channel MOSFET formed by the p$^+$-type source/drain regions 1206*a* and 1206*b* and the gate electrode 1208*a* and the n-channel MOSFET formed by the n$^+$-type source/drain regions 1207*a* and 1207*b* and the same gate electrode 1208*a* constitute an inverter 205*c* of the 2-1 selector circuit of FIG. 6.

The p-channel MOSFET formed by the p$^+$-type source/drain regions 1206*b* and 1206*c* and the gate electrode 1208*b* and the n-channel MOSFET formed by the n$^+$-type source/drain regions 1207*b* and 1207*c* and the same gate electrode 1208*b* constitute an inverter 205*d* of the 2-1 selector circuit of FIG. 6.

The inverted input signal A0 is transmitted to the n$^+$-type source/drain region 1207*d* through the wiring line 1420. The inverted input signal A0 is further transmitted to the p$^+$-type source/drain region 1206*f* through the wiring line 1423. The inverted input signal B0 is transmitted to the n$^+$-type source/drain region 1207*f* and the p$^+$-type source/drain region 1206*d* through the wiring line 1421. The p$^+$-type source/drain region 1206*e* and the n$^+$-type source/drain region 1207*e* are electrically connected to one another through the wiring line 1422.

Thus, the p- and n-channel MOSFETs using the gate electrode 1208*c* constitute the CMOS transfer gate 206*a* of the 2-1 selector circuit of FIG. 6. The p- and n-channel MOSFETs using the gate electrode 1208*d* constitute another CMOS transfer gate 206*b* thereof.

The select signal S is applied to the gate electrode 1208*d* through the wiring line 1404. The inverted select signal S is applied to the gate electrode 1208*c* through the wiring lines 1424 and 1425.

The wiring line 1422, through which the output signals of the first and second transfer gates 206*a* and 206*b*, is electrically connected to the gate electrode 1208*d* serving as the input terminal of the inverter 205*d*. The inverted input signal for the inverter 205*d* is derived from its output terminal as the output signal X.

In recent years, to increase the operation speed and to decrease the power consumption and the chip area due to the number diminishment of electronic elements, pass-transistor logic circuits have been used practically in CMOS logic Large-Scale Integrated circuits (LSIs).

The basic constituents of the pass transistors logic circuits are CMOS transfer gate circuit and a 2-1 selector circuit. The 2-1 selector circuit is formed by two CMOS transfer gate circuits. The 2-1 selector circuit is often used in a latch or flip-flop circuit also.

However, when the 2-1 selector circuit is constituted by using the bulk CMOS technology, metal wiring lines will occupy a comparatively large area of a cell block, as shown in FIG. 4. This results in degradation of the integration level of the macro cells and the LSI chip.

FIG. 4 shows the layout of the basic cells of an SOG array using the bulk CMOS technology. Even if the same SOG array is constituted by the popular standard cells, the 2-1 selector circuit shown in FIG. 6 will occupy approximately the same chip area as that of FIG. 4.

Additionally, the Japanese Non-Examined Patent Publication No. 6-140630, which was published in May 1994, discloses an improved semiconductor device having p- and n-channel thin-film transistors (TFTs). In this device, the source and drain electrodes of the p- and n-channel thin-film transistors constitute a p-n junction. The current and voltage characteristics of the p-n junction is improved by converting the neighborhood of the p-n junction to silicide.

As explained above, with the conventional MOSFET layout of a CMOS SOG array shown in FIG. 1, the p-channel MOSFETs are aligned in a row parallel to the power supply line 1211 and the n-channel MOSFETs are aligned in another row parallel to the ground line 1212. The row of the p-channel MOSFETs is located in the first area 1201 or n-type well 1302. The row of the n-channel MOSFETs is located in the second area 1202 or p-type well 1303.

The isolation region 1200 is necessarily located between the n- and p-type wells 1202 and 1203.

Therefore, when the drain regions of the n- and p-channel MOSFETs are coupled together at a node such as an output node of a NAND gate, a metal wiring line needs to be used, which results in increase in occupation area of the wiring lines. This occupation area increase prevents the integration level of the macro cells and/or semiconductor chip from being increased.

This integration level degradation becomes conspicuous for the layout of CMOS transfer gate circuits and/or 2-1 selector circuits, which are basic components of the pass transistor, latch, and flip-flop circuits. The 2-1 selector circuit is formed by combining two CMOS transfer gate circuits.

Moreover, with the conventional semiconductor device disclosed in the Japanese Non-Examined Patent Publication No. 6-140630, the current and voltage characteristics of the p-n junction is improved. However, there is no disclosure nor teaching about the layout and interconnection of the p- and n-channel TFTs.

SUMMARY OF THE INVENTION

Accordingly, an object of the present invention is to provide a semiconductor integrated circuit device that decreases the chip area of wiring lines interconnecting p- and n-channel IGFETs.

Another object of the present invention is to provide a semiconductor integrated circuit device that raises the integration level or density of p- and n-channel IGFETs.

The above objects together with others not specifically mentioned will become clear to those skilled in the art from the following description.

A semiconductor integrated circuit device according to a first aspect of the present invention is comprised of a semiconductor layer formed on an insulating substrate. The semiconductor layer has a first area extending along a first direction and a second area extending along the first direction. The first and second areas are adjacent to one another.

A first IGFET of a first conductivity type is formed in the first area of the semiconductor layer. The first IGFET has a first pair of source/drain regions.

A second IGFET of a second conductivity type opposite to the first conductivity type is formed in the first area of the semiconductor layer. The second IGFET has a second pair of source/drain regions. One of the second pair of source/drain regions is electrically connected to one of the first pair of source/drain regions by a first interconnection diffusion region.

A third IGFET of the first conductivity type is formed in the second area of the semiconductor layer. The third IGFET has a third pair of source/drain regions. One of the third pair of source/drain regions is electrically connected to one of the second pair of source/drain regions by a second interconnection diffusion region.

With the semiconductor integrated circuit device according to the first aspect of the present invention, the semiconductor layer and the insulating substrate constitute a so-called SOI structure. Also, the first and second IGFETs are formed in the first area of the semiconductor layer and the third IGFET is formed in the second area of the semiconductor layer. Therefore, the semiconductor layer needs to have no isolation region for electrical isolation of the first and second areas.

Moreover, one of the second pair of source/drain regions of the second IGFET and one of the first pair of source/drain regions of the first IGFET, which are of different or opposite conductivity types, are electrically connected to one another by the first interconnection diffusion region. Similarly, one of the third pair of source/drain regions of the third IGFET and one of the second pair of source/drain regions of the second IGFET, which are of different or opposite conductivity types, are electrically connected to one another by the second interconnection diffusion region. Therefore, no wiring line is necessary to electrically interconnect the first, second, and third IGFETs.

Accordingly, the chip area of wiring lines interconnecting the p- and n-channel TGFETs is decreased. This means that the integration level or density of the p- and n-channel IGFETs is raised.

In a preferred embodiment of the device according to the first aspect of the present invention, the first interconnection diffusion region is formed by at least one of the one of the first pair of source/drain regions and the one of the second pair of source/drain regions, and the second interconnection diffusion region is formed by at least one of the one of the second pair of source/drain regions and the one of the third pair of source/drain regions. In this case, there is an additional advantage that the chip area of the first and second interconnection diffusion regions is further decreased.

In another preferred embodiment of the device according to the first aspect of the present invention, a first power supply line for supplying a first electric potential is formed to be overlapped with the first area. A second power supply line for supplying a second electric potential is formed to be overlapped with the second area. The first and second power supply lines extend along the first direction of the first and second areas.

In still another preferred embodiment of the device according to the first aspect of the present invention, the first, second, and third IGFETs have first, second, and third gate electrodes extending along a second direction perpendicular to the first direction, respectively. The second and third gate electrodes are separated from each other and located on a same line.

In a further preferred embodiment of the device according to the first aspect of the present invention, a fourth IGFET of the second conductivity type is further provided in the second area. The fourth IGFET has a fourth pair of source/drain regions. One of the fourth pair of source/drain regions is electrically connected to one of the third pair of source/drain regions which is not electrically connected to the second interconnection diffusion region.

In a still further preferred embodiment of the device according to the first aspect of the present invention, first and second unit cells are further provided. Each of the first and second unit cells includes the first, second, and third IGFETs and the first and second interconnection diffusion regions. The first and second unit cells are arranged so that the second unit cell forms a mirror image of the first cell. In this case, there is an additional advantage that the number of parts such as power supply lines, contact regions, and so on is decreased, because they may be commonly used by laying out them at the interface of the first and second unit cells. This raises further the integration level or density of the p- and n-channel IGFETs.

A semiconductor integrated circuit device according to a second aspect of the present invention is comprised of a semiconductor layer formed on an insulating substrate, a first plurality of IGFETs of a first conductivity type, and a second plurality of IGFETs of a second conductivity type opposite to the first conductivity type.

The semiconductor layer has a first area extending along a first direction and a second area extending along the first direction. The first and second areas are adjacent to one another.

One of the first plurality of IGFETs is located in the second area of the semiconductor layer. The remaining first plurality of IGFETs are regularly arranged in the first area.

One of the second plurality of IGFETs is located in the first area of the semiconductor layer. The remaining second plurality of IGFETs are regularly arranged in the second area.

The one of the first plurality of IGFETs located in the second area has a pair of source/drain regions, one of which is electrically connected to one of a pair of source/drain regions of an adjoining one of the remaining second plurality of IGFETs by a first interconnection diffusion region.

The one of the second plurality of IGFETs located in the first area has a pair of source/drain regions, one of which is electrically connected to one of a pair of source/drain regions of an adjoining one of the remaining first plurality of IGFETs by a second interconnection diffusion region.

The pair of source/drain regions of the one of the first plurality of IGFETs located in the second area is electrically connected to the pair of source/drain regions of the one of the second plurality of IGFETs located in the first area by third and fourth interconnection diffusion regions, respectively.

With the semiconductor integrated circuit device according to the second aspect of the present invention, the semiconductor layer and the insulating substrate constitute a so-called SOI structure. Also, the first and second pluralities of IGFETs are formed in the first or second area of the semiconductor layer. Therefore, the semiconductor layer needs to have no isolation region for electrical isolation of the first and second areas.

Moreover, the one of the first plurality of IGFETs located in the second area is electrically connected to the adjoining one of the remaining second plurality of IGFETs by the first interconnection diffusion region. The one of the second plurality of IGFETs located in the first area is electrically connected to the adjoining one of the remaining first plurality of IGFETs by the second interconnection diffusion region. The one of the first plurality of IGFETs located in the second area is electrically connected to the one of the second plurality of IGFETs located in the first area by the third and fourth interconnection diffusion regions, respectively.

Accordingly, the chip area of wiring lines interconnecting the p- and n-channel IGFETs is decreased. This means that the integration level or density of the p- and n-channel IGFETs is raised.

In a preferred embodiment of the device according to the second aspect of the present invention, a first power supply line for supplying a first electric potential is formed to be overlapped with the first area. A second power supply line for supplying a second electric potential is formed to be overlapped with the second area. The first and second power supply lines extend along the first direction of the first and second areas.

In another preferred embodiment of the device according to the second aspect of the present invention, the one of the first plurality of IGFETs located in the second area and the one of the second plurality of IGFETs located in the first area have first and second gate electrodes extending along a second direction perpendicular to the first direction, respectively. The first and second gate electrodes are separated from each other and located on a same line.

In still another preferred embodiment of the device according to the second aspect of the present invention, first and second unit cells are further provided. Each of the first and second unit cells includes the one of the first plurality of IGFETs located in the second area and the one of the second plurality of IGFETs located in the first area. The first and second unit cells are arranged so that the second unit cell forms a mirror image of the first cell. In this case, there is an additional advantage that the number of power supply lines and/or contact regions is decreased, which reduces the integration level or density of the p- and n-channel IGFETs.

In the semiconductor integrated circuit devices according to the first and second aspects of the present invention, the advantages of the invention will be remarkable when logic circuits including a lot of CMOS transfer gates (for example, selector, latch, and flip-flop circuits) are integrated.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
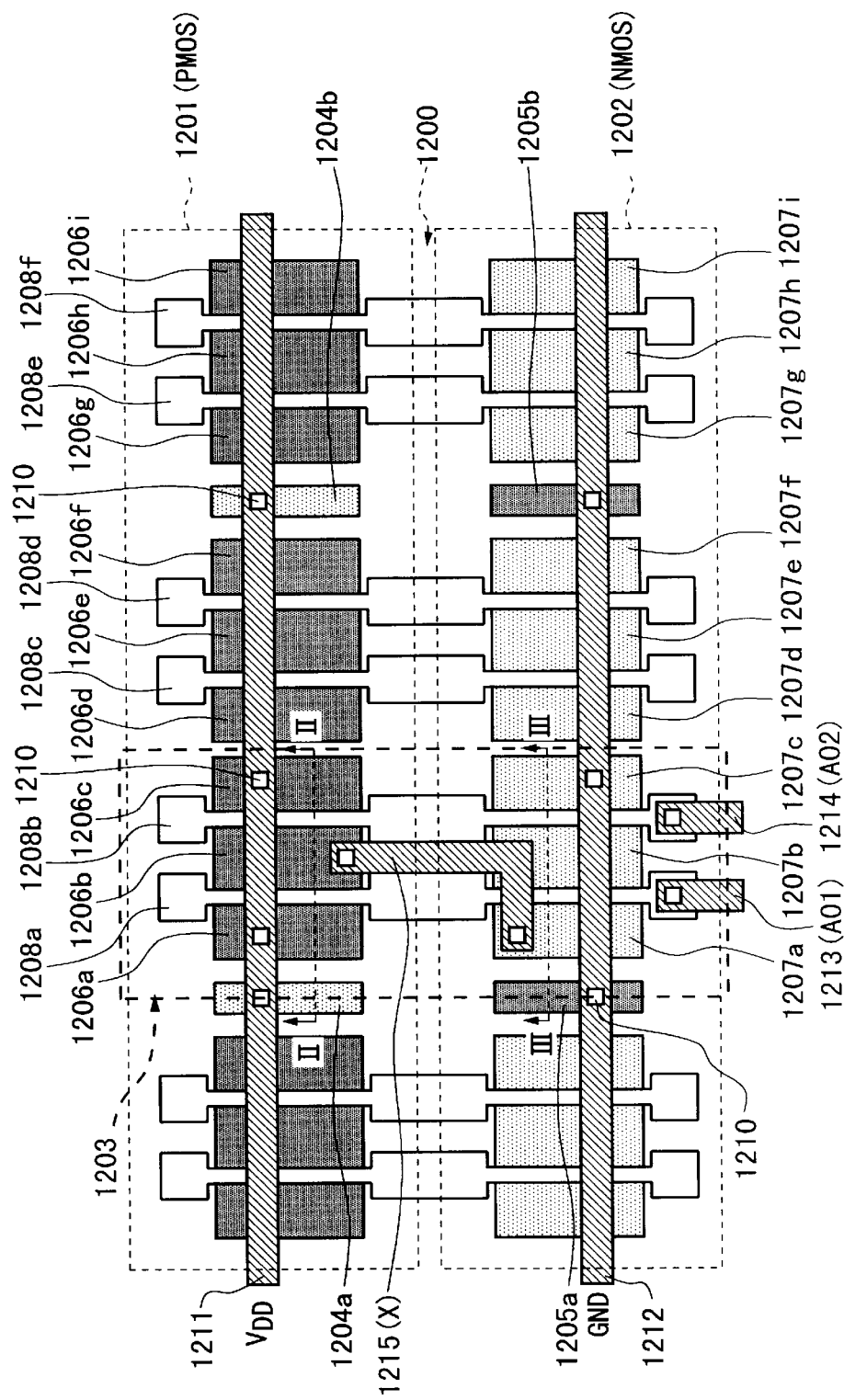
FIG. 1 shows a conventional layout of a CMOS SOG array, which includes a logic block of a two-input NAND circuit shown in FIG. 19.
Figure 2:
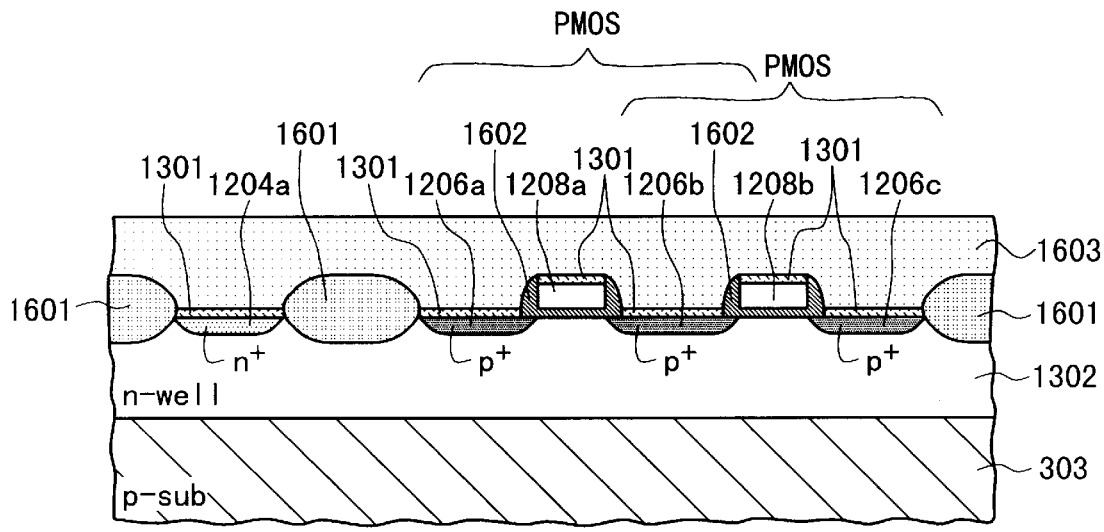
FIG. 2 shows a cross-section along the line II—II in FIG. 1.
Figure 3:
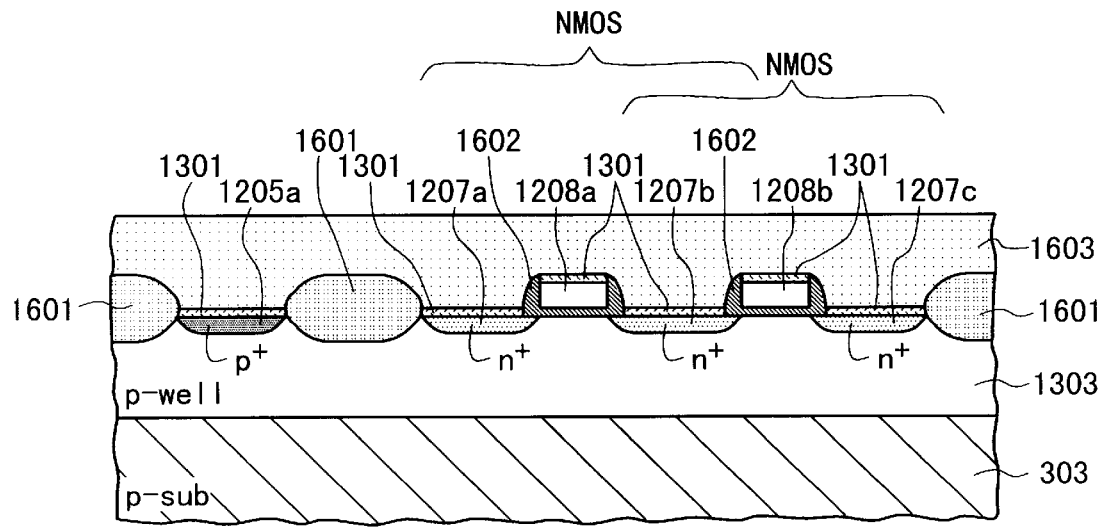
FIG. 3 shows a cross-section along the line III—III in FIG. 1.

Preferred embodiments of the present invention will be described below referring to the drawings attached.

First Embodiment

Figure 5:
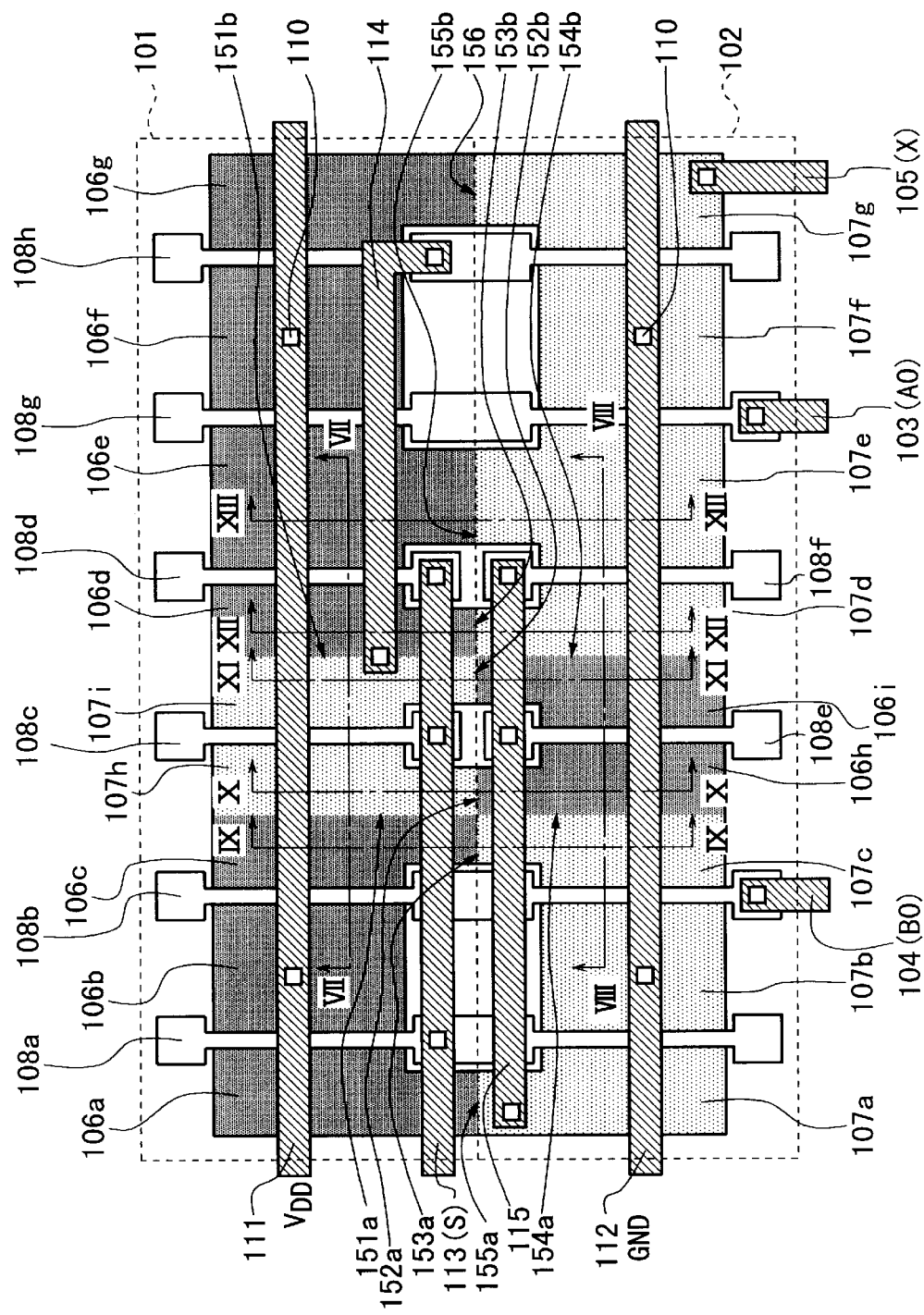
FIG. 5 shows a layout of a CMOS SOG array according to a first embodiment of the present invention, which includes a logic block of a 2-1 selector circuit shown in FIG. 6.
Figure 6:
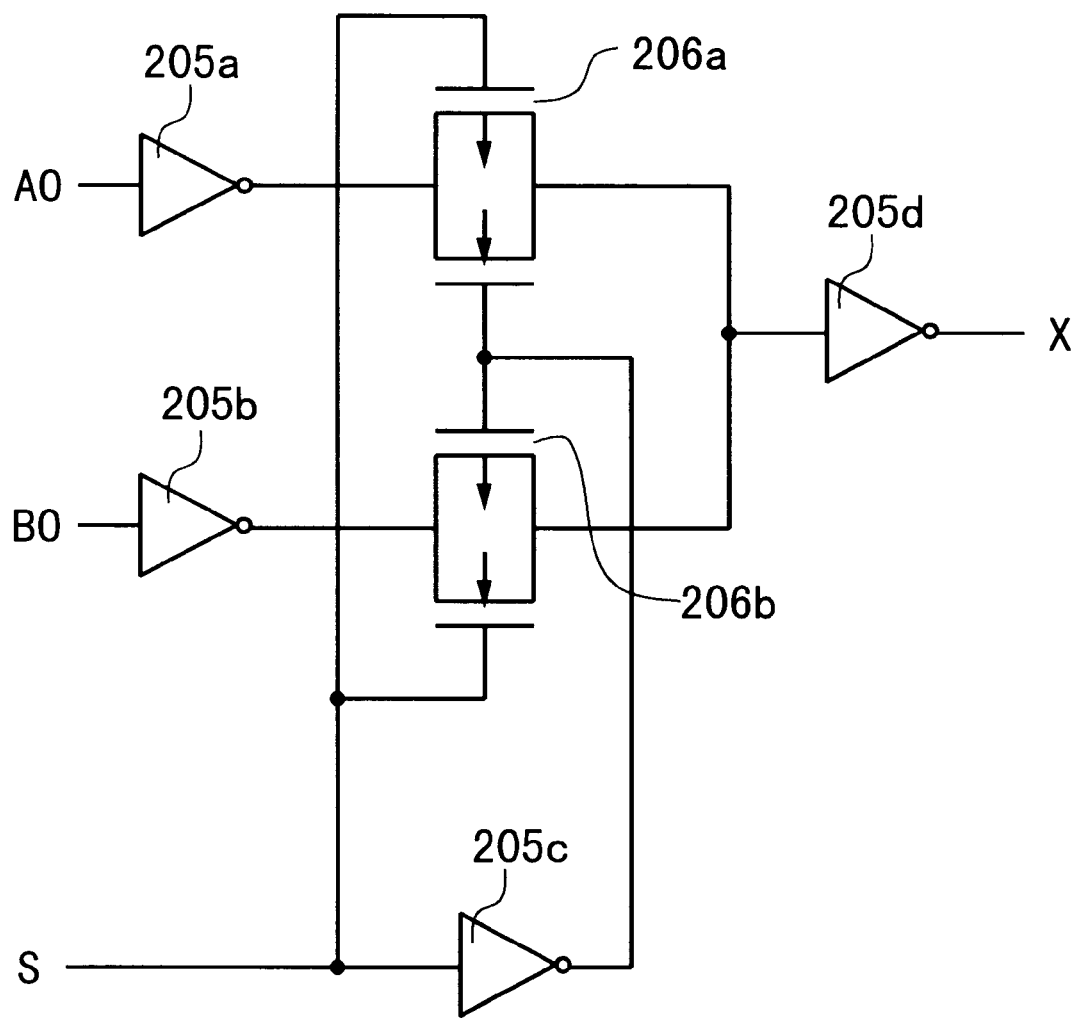
FIG. 6 is a block diagram of a 2-1 selector circuit.

As shown in FIG. 5, a CMOS SOG array according to a first embodiment of the present invention includes a logic block of a 2-1 selector circuit shown in FIG. 6. The 2-1 selector circuit is formed by using pass transistors with the CMOS transfer gate structure.

A first rectangular area 101 and a second rectangular area 102 are formed to be contacted with each other at their interfaces or boundaries, forming a unit cell. These areas 101 and 102 are electrically connected at the interfaces or boundaries. Unlike the above-explained conventional layouts shown in FIGS. 1 and 4, no isolation area is located between these areas 101 and 102.

Although this layout includes a lot of IGFET areas around the first and second areas 101 and 102, they are not shown here for the sake of simplification.

In the first area 101, eight polysilicon gate electrodes 108a, 108b, 108c, 108d, 108e, 108f, 108g, and 108h are arranged along the longitudinal axis of the area 101 at regular intervals. These gate electrodes 108a, 108b, 108c, 108d, 108e, 108f, 108g, and 108h extend vertically perpendicular to the longitudinal axis of the area 101.

The four gate electrodes 108a, 108b, 108g, and 10h run over the first and. second areas 101 and 102 from the upper side of the first area 101 to the lower side of the second area 102 in FIG. 5. The two gate electrodes 108c and 108d run over the first area 101 only. The two gate electrodes 108e and 108f run over the second area 102 only.

Seven p$^+$-type diffusion regions or source/drain regions 106a, 106b, 106c, 106d, 106e, 106f, and 106g and two n$^+$-type diffusion regions or source/drain regions 107h and 107i are formed in the first area 101. The p$^+$-type source/drain regions 106a and 106b are located at each side of the gate electrode 108a. The p$^+$-type source/drain regions 106b and 106c are located at each side of the gate electrode 108b. The n$^+$-type source/drain regions 107h and 107i are located at each side of the gate electrode 108c. The p$^+$-type source/drain regions 106d and 106e are located at each side of the gate electrode 108d. The p$^+$-type source/drain regions 106e and 106f are located at each side of the gate electrode 108g. The p$^+$-type source/drain regions 106f and 106g are located at each side of the gate electrode 108h.

Seven n$^+$-type source/drain regions 107a, 107b, 107c, 107d, 107e, 107f, and 107g and two p$^+$-type source/drain regions 106h and 106i are formed in the second area 102. The n$^+$-type source/drain regions 107a and 107b are located at each side of the gate electrode 108a. The n$^+$-type source/drain regions 107b and 107c are located at each side of the gate electrode 108b. The p$^+$-type source/drain regions 106h and 106i are located at each side of the gate electrode 108e. The ne-type source/drain regions 107d and 107e are located at each side of the gate electrode 108f. The n$^+$-type source/drain regions 107e and 107f are located at each side of the gate electrode 108g. The n$^+$-type source/drain regions 107f and 107g are located at each side of the gate electrode 108h.

As seen from FIG. 5, the interface of the p$^+$-type source/drain region 106c and the n$^+$-type source/drain region 107h forms a p-n junction 151a. The interface of the p$^+$-type source/drain region 106d and the n$^+$-type source/drain region 107i forms a p-n junction 151b. The interface of the n$^+$-type source/drain region 107h and the p$^+$-type source/drain region 106h forms a p-n junction 152a. The interface of the n$^+$-type source/drain region 107i and the p$^+$-type source/drain region 106i forms a p-n junction 152b. The interface of the p$^+$-type source/drain region 106c and the n$^+$-type source/drain region 107c forms a p-n junction 153a. The interface of the p$^+$-type source/drain region 106d and the n$^+$-type source/drain region 107d forms a p-n junction 153b. The interface of the n$^+$-type source/drain region 107c and the p$^+$-type source/drain region 106h forms a p-n junction 154a. he interface of the n$^+$-type source/drain region 107d and the p$^+$-type source/drain region 106i forms a p-n junction 154b. The interface of the p$^+$-type source/drain region 106a and the n$^+$-type source/drain region 107a forms a p-n junction 155a. The interface of the p$^+$-type source/drain region 106e and the n$^+$-type source/drain region 107e forms a p-n junction 155b. The interface of the p$^+$-type source/drain region 106g and the n$^+$-type source/drain region 107g forms a p-n junction 156.

The p$^+$-type source/drain regions 106a and 106b and the corresponding gate electrode 108a constitute a p-channel MOSFETs in the first area 1201. The p$^+$-type source/drain regions 106b and 106c and the corresponding gate electrode 108b constitute a p-channel MOSFETs in the first area 1201. The source/drain region 106b is commonly used by these two p-channel MOSFETs.

The n$^+$-type source/drain regions 107a and 107b and the corresponding gate electrode 108a constitute an n-channel MOSFET in the second area 1202. The n$^+$-type source/drain regions 107b and 107c and the corresponding gate electrode 108b constitute an n-channel MOSFET in the second area 1202. The source/drain region 107b is commonly used by these two n-channel MOSFETs.

The p$^+$-type source/drain regions 106a and 106c are electrically connected to the n$^+$-type source/drain regions 107a and 107c through the p-n junctions 155a and 153a, respectively.

The n$^+$-type source/drain regions 107h and 107i and the corresponding gate electrode 108c constitute an n-channel MOSFET in the first area 101. The p$^+$-type source/drain regions 106h and 106i and the corresponding gate electrode 108e constitute a p-channel MOSFET in the second area 102.

The n$^+$-type source/drain regions 107h and 107i are electrically connected to the p$^+$-type source/drain regions 106h and 106i through the p-n junctions 152a and 152b, respectively. Further, the n$^+$-type source/drain regions 107h and 107i are electrically connected to the p$^+$-type source/drain regions 106c and 106d through the p-n junctions 151a and 151b, respectively. The p$^+$-type source/drain regions 106h and 106i are electrically connected to the n$^+$-type source/drain regions 107c and 107d through the p-n junctions 154a and 154b, respectively.

The p$^+$-type source/drain regions 106d and 106e and the corresponding gate electrode 108d constitute a p-channel MOSFET in the first area 101. The p⁺-type source/drain regions 106e and 106f and the corresponding gate electrode 108g constitute a p-channel MOSFET in the first area 101. The p⁺-type source/drain regions 106f and 106g and the corresponding gate electrode 108h constitute a p-channel MOSFET in the first area 101.

The n⁺-type source/drain regions 107d and 107e and the corresponding gate electrode 108f constitute an n-channel MOSFET in the second area 102. The n⁺-type source/drain regions 107e and 107f and the corresponding gate electrode 108g constitute an n-channel MOSFET in the second area 102. The n⁺-type source/drain regions 107f and 107g and the corresponding gate electrode 108h constitute an n-channel MOSFET in the second area 102.

The p⁺-type source/drain regions 106d and 106e are electrically connected to the n⁺-type source/drain regions 107d and 107e through the p-n junctions 153b and 155b, respectively. The p⁺-type source/drain region 106g is electrically connected to the n⁺-type source/drain region 107g through the p-n junction 156.

The p⁺-type source/drain region 106b is not electrically connected to the n⁺-type source/drain region 107b due to a rectangular space. The p⁺-type source/drain region 106f is not electrically connected to the n⁺-type source/drain region 107f due to a rectangular space.

Thus, five p-channel MOSFETs and one n-channel MOSFET are regularly arranged in the first area 101 along its longitudinal axis. The number of the MOSFETs in the first area 101 is six. Similarly, five n-channel MOSFETs and one p-channel MOSFET are regularly arranged in the second area 101 along its longitudinal axis. The number of the MOSFETs in the second area 102 is six. Therefore, the total number of the MOSFETs in this unit cell is twelve.

A linear power supply line 111 for supplying a power supply voltage or potential $V_{DD}$ is formed over the first region 101 to extend horizontally along the longitudinal axis of the first area 101. The power supply line 111 is electrically connected to the p⁺-type source/drain regions 106b and 106f through corresponding contact holes 110.

A linear ground line 112 for supplying a ground voltage or potential is formed over the second area 102 to extend horizontally along the longitudinal axis of the second area 102, where the ground line 112 is parallel to the power supply line 111. The ground line 112 is electrically connected to the n⁺-type diffusion regions 107b and 107f through corresponding contact holes 1210.

A metal wiring line 113 is connected to the polysilicon gate electrodes 108a, 108c and 108d through the corresponding contact holes 110. The wiring line 113 is electrically connected to an input terminal (not shown) of the 2-1 selector circuit in FIG. 6, to which a select signal S is applied.

A metal wiring line 114 is connected to the polysilicon gate electrode 108h and the p-n junction 151b through the corresponding contact holes 110.

A metal wiring line 115 is connected to the polysilicon gate electrodes 108e and 108f and the n⁺-type source/drain region 107a through the corresponding contact holes 110.

A metal wiring line 103 is connected to the polysilicon gate electrode 108d through the corresponding contact hole 110. The wiring line 103 is electrically connected to a first input terminal (not shown) of the 2-1 selector circuit in FIG. 6, to which a first input signal A0 is applied.

A metal wiring line 104 is connected to the polysilicon gate electrode 108b through the corresponding contact hole 110. The wiring line 104 is electrically connected to a second input terminal (not shown) of the 2-1 selector circuit in FIG. 6, to which a second input signal B0 is applied.

A metal wiring line 105 is connected to the n⁺-type source/drain region 107g through the corresponding contact hole 110. The wiring line 105 is electrically connected to an output terminal (not shown) of the 2-1 selector circuit in FIG. 6, from which an output signal X is derived.

Figure 4:
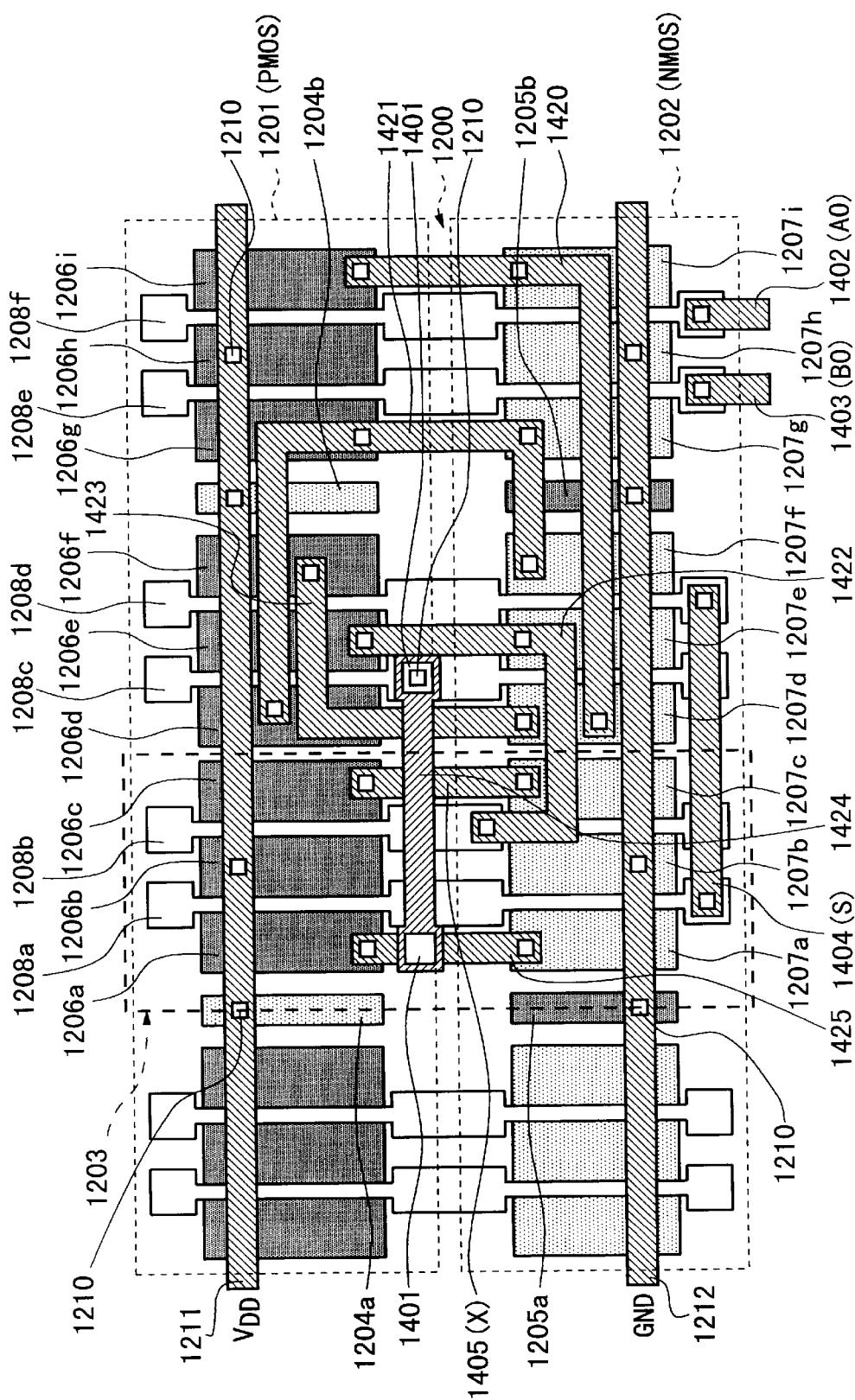
FIG. 4 shows another conventional layout of a CMOS SOG array, which includes a logic block of a 2-1 selector circuit shown in FIG. 6.

Unlike the above-explained conventional layouts shown in FIGS. 1 and 4, the first area 101 includes both p- and n-channel MOSFETs horizontally aligned along the longitudinal axis of the area 101. The second area 102 includes both p- and n-channel MOSFETs horizontally aligned along the longitudinal axis of the area 102.

Figure 7:
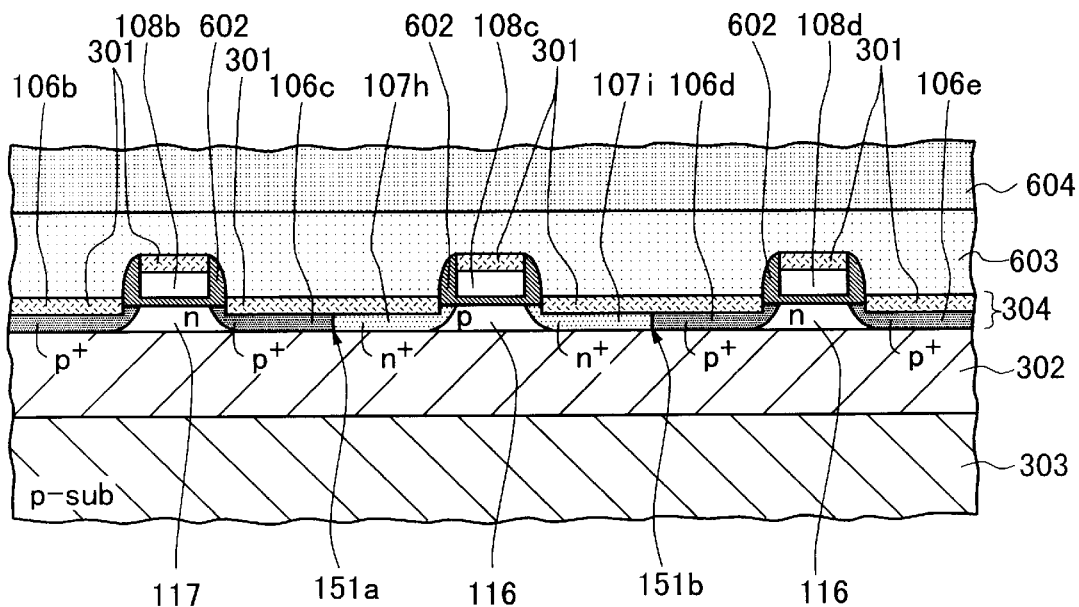
FIG. 7 shows a cross-section along the line VII—VII in FIG. 5.
Figure 8:
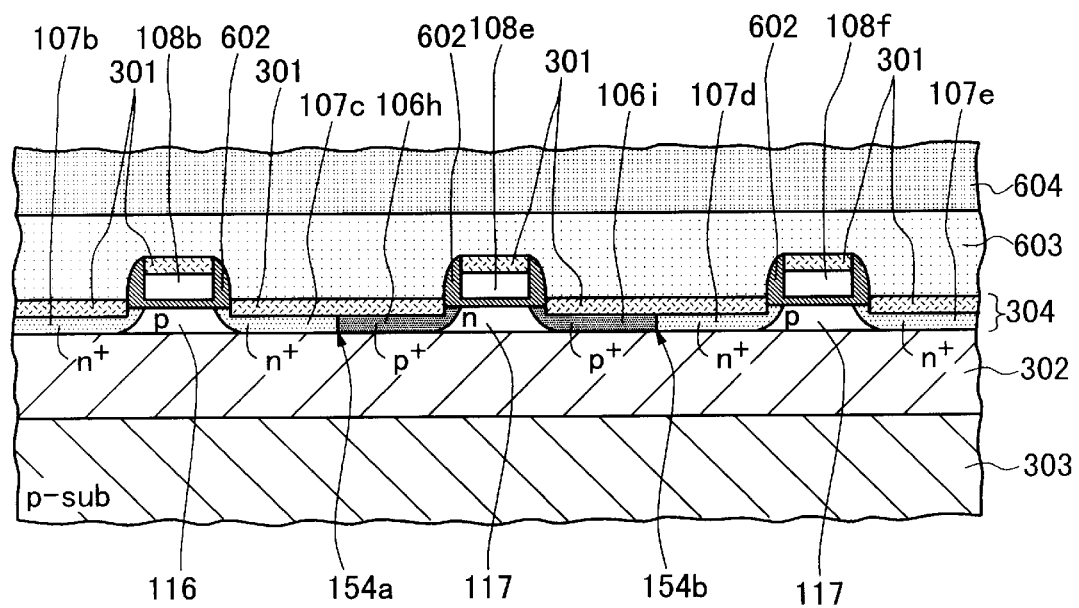
FIG. 8 shows a cross-section along the line VIII—VIII in FIG. 5.
Figure 9:
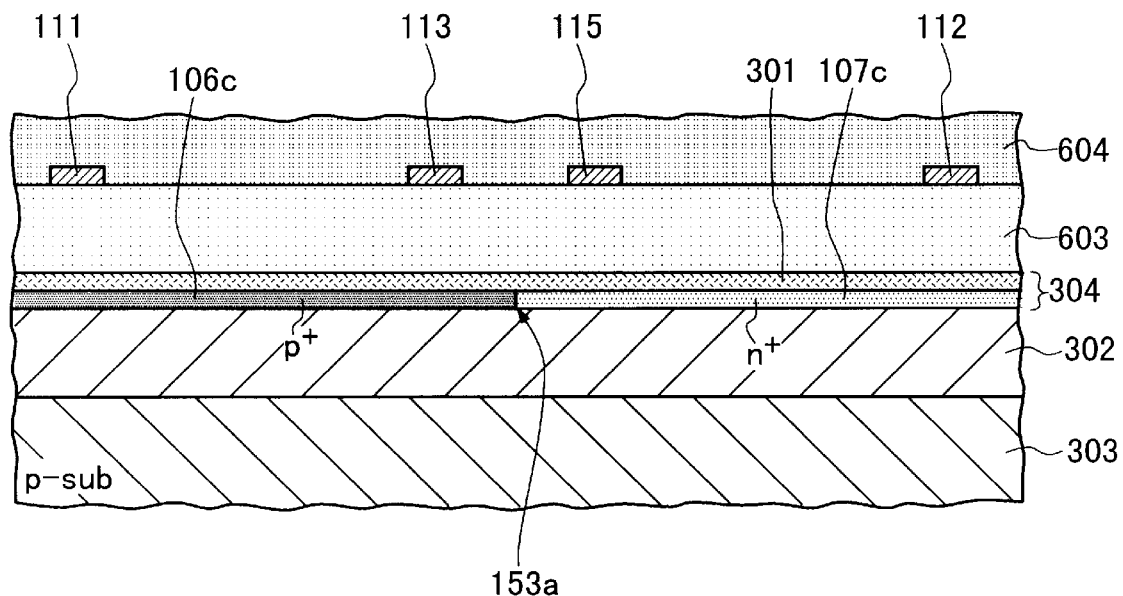
FIG. 9 shows a cross-section along the line IX—IX in FIG. 5.
Figure 10:
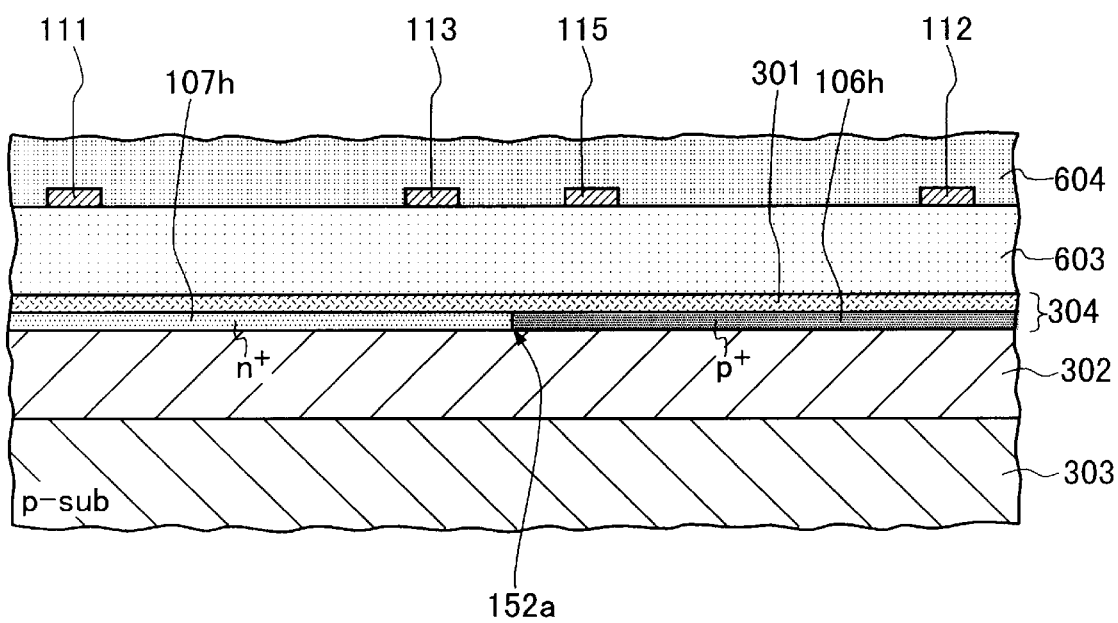
FIG. 10 shows a cross-section along the line X—X in FIG. 5.
Figure 11:
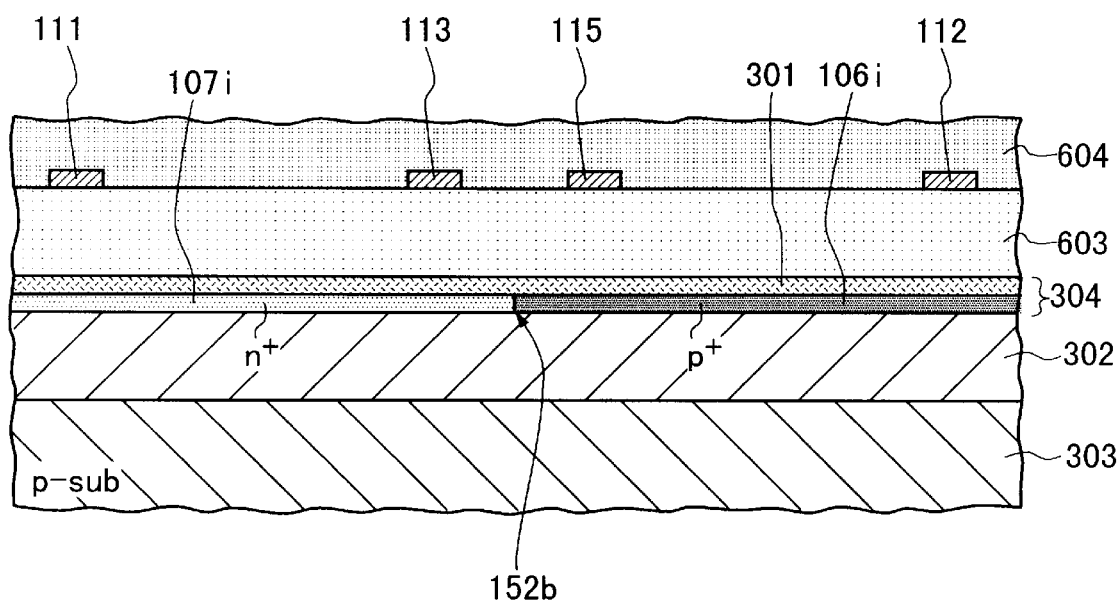
FIG. 11 shows a cross-section along the line XI—XI in FIG. 5.
Figure 12:
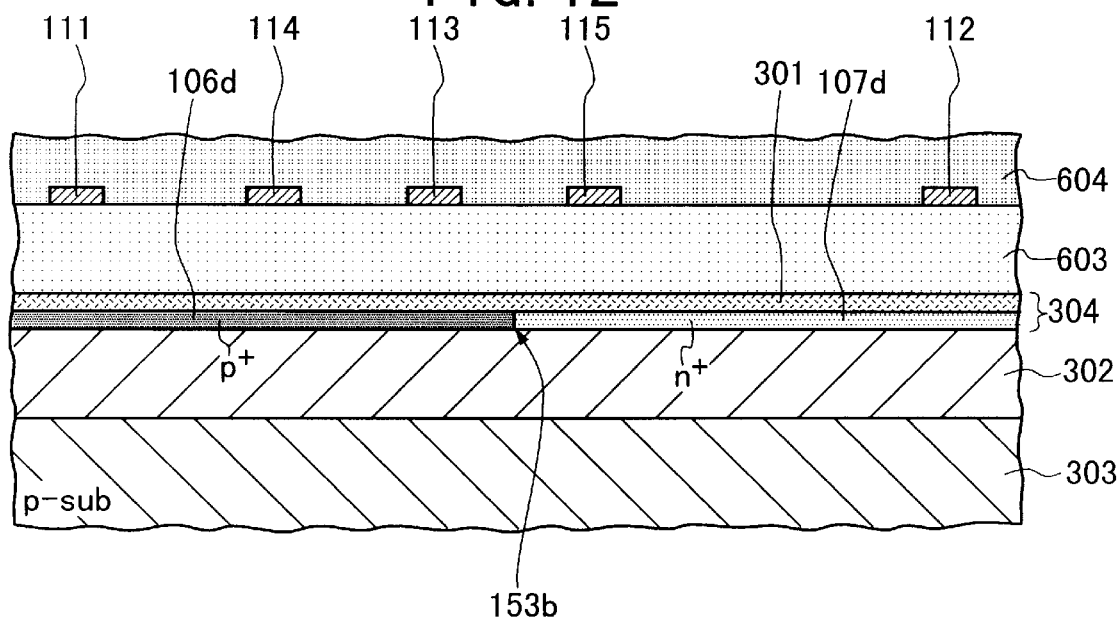
FIG. 12 shows a cross-section along the line XII—XII in FIG. 5.

As shown in FIGS. 7 to and 13, a buried silicon-oxide layer 302 is formed on a main surface of a p-type single-crystal silicon substrate 303. A single-crystal silicon layer 304 is formed on the buried oxide layer 302. The silicon layer 304 is partitioned according to the pattern or layout of the source/drain regions in the first and second areas 101 and 102. The partitions of the silicon layer 304 in which the p⁺-type source/drain regions are formed is of an n-type, and those in which the n⁺-type source/drain regions are formed is of a p-type.

The power supplied voltage or potential $V_{DD}$ is applied to the n⁺-type source/drain regions 106b and 106f through the corresponding through holes 110. The ground voltage or potential is applied to the p⁺-type source/drain regions 107b and 107f through the corresponding through holes 110.

Figure 13:
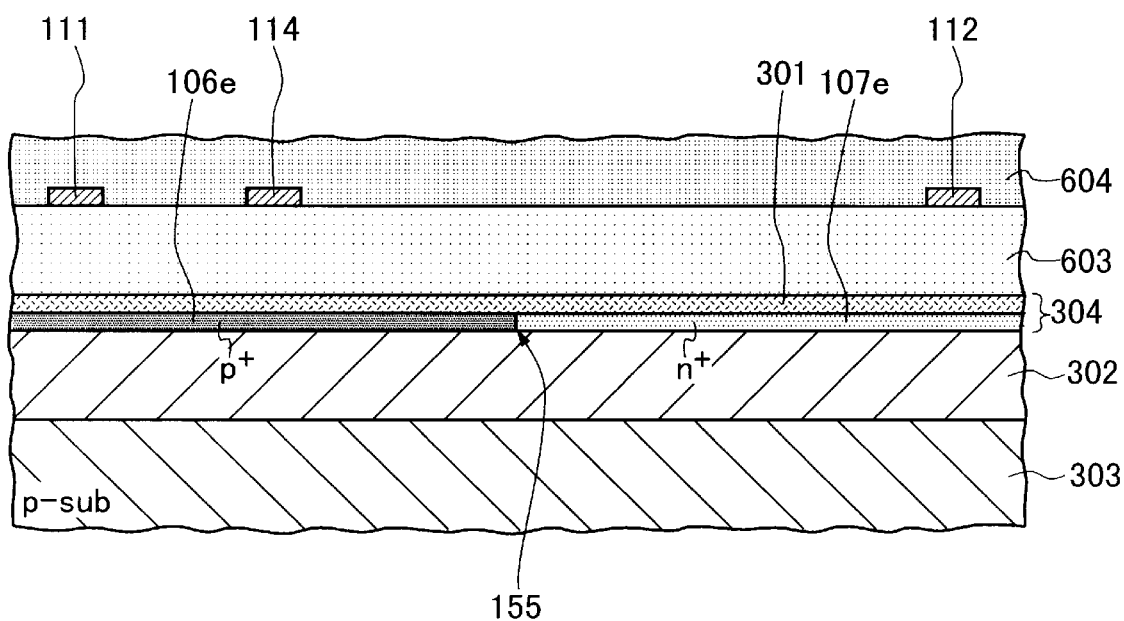
FIG. 13 shows a cross-section along the line XIII—XIII in FIG. 5

As clearly shows in FIGS. 7 and 13, to decrease the electric resistance, the surface areas 301 of each gate electrode and each source/drain region are made of silicide. In other words, the surfaces of each gate electrode and each source/drain region are covered with silicide layers 301, respectively.

The neighborhood of each p-n junction of the adjoining p⁺- and n⁺-type source/drain regions serves as an interconnection diffusion region.

Because the semiconductor integrated circuit device according to the first embodiment employs an SOI substrate, no well is provided in the silicon layer 304. Therefore, a source/drain region of a p-channel MOSFET and that of an n-channel MOSFET, where their electric potentials are the same, may be electrically connected to one another with the use of an interconnection diffusion region.

If the silicide layers 301 are not formed in the adjoining p⁺- and n⁺-type source/drain region, respectively, a voltage drop corresponding to a typical p-n junction diode will occur at the corresponding p-n junction. The silicide layers 301 eliminate this voltage drop.

The reference numeral 602 denotes a dielectric of each of the n- and p-channel MOSFETs. A lower part of the dielectric 602 serves as a gate insulator and a pair of side parts thereof serve as sidewall spacers.

The reference numeral 603 denotes an interlayer dielectric layer formed to cover the silicide layers 301 and the uncovered dielectrics 602. The power supply and ground lines 111 and 112 and the metal wiring lines 103, 104, 105, 113, 114, and 115 are located on the interlayer dielectric layer 603, as shown in FIGS. 9 to 13.

The reference numeral 604 denotes another interlayer dielectric layer formed on the interlayer dielectric layer 603 to cover the power supply and ground lines 111 and 112 and the metal wiring lines 103, 104, 105, 113, 114, and 115.

The p- and n-channel MOSFETs using the common gate electrode 108g, to which the metal wiring line 103 for the first input signal A0 is connected, constitute a CMOS inverter 205a in FIG. 6. The p- and n-channel MOSFETs using the common gate electrode 108b, to which the metal wiring line 104 for the second input signal B0, constitute a CMOS inverter 205b in FIG. 6.

The p- and n-channel MOSFETs using the common gate electrode 108a, to which the metal wiring line 113 for the select signal S is connected, constitute a CMOS inverter 205c in FIG. 6. The p- and n-channel MOSFETs using the common gate electrode 108h constitute a CMOS inverter 205d in FIG. 6.

The two p-channel MOSFETs using the gate electrodes 108d and 108e and two n-channel MOSFETs using the gate electrodes 108c and 108f constitute CMOS transfer gates 206a and 206b in FIG. 6, respectively.

With the CMOS SOG array according to the first embodiment, since the p- and n-channel MOSFETs are electrically connected by the interconnection diffusion regions, no metal wiring line is necessary for this purpose. Therefore, compared with the conventional layout as shown in FIG. 4, the chip area is decreased by approximately 30% at a design rule where the gate length is 0.35 µm.

Additionally, although the number of the metal wiring lines is seven in the conventional layout as shown in FIG. 4 excluding the power supply and ground lines, it is decreased to three in the first embodiment. This reduces the chip area of the metal wiring lines and raises the integration level or density of p- and n-channel MOSFETs.

Second Embodiment

Figure 14:
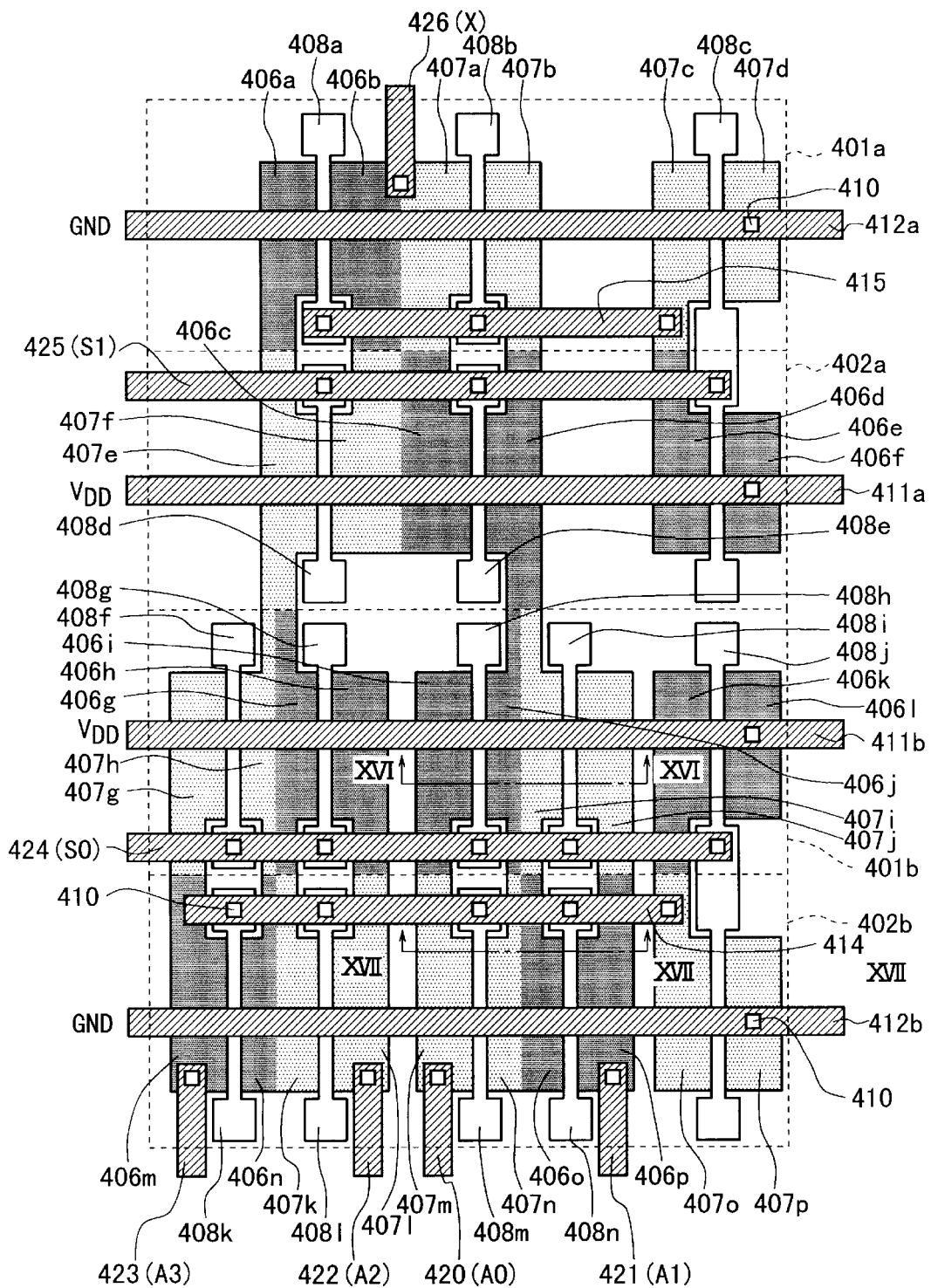
FIG. 14 shows a layout of a CMOS SOG array according to a second embodiment of the present invention, which includes a logic block of a 4-1 selector circuit shown in FIG. 15.
Figure 15:
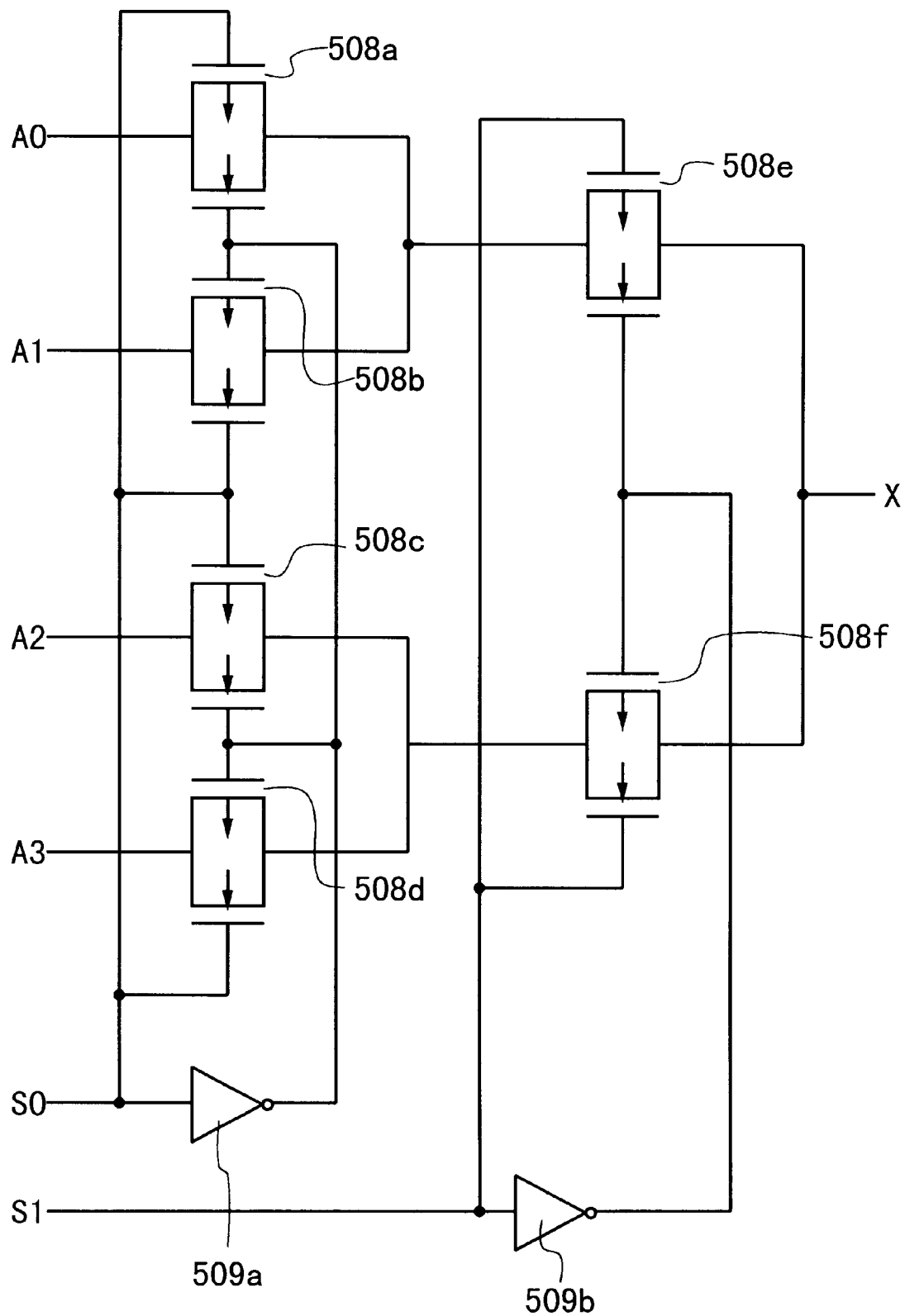
FIG. 15 is a block diagram of a 4-1 selector circuit.

FIGS. 14 to 17 show a CMOS SOG array according to a second embodiment, which includes a logic block of a 4-1 selector circuit shown in FIG. 15.

As shown in FIG. 14, a first rectangular area 401a, a second rectangular area 402a, a third rectangular area 401b, and a fourth rectangular area 402b are formed to be contacted with each other at their interfaces or boundaries, forming a unit cell. These areas 401a, 402a, 401b, and 402b are electrically connected at the interfaces or boundaries. No isolation area is located between two adjoining ones of the areas 401a, 402a, 401b, and 402b.

Two power supply lines 411a and 411b for supplying a voltage $V_{DD}$ are formed in the second and third areas 402a and 401b to extend along their longitudinal axes, respectively. Two ground lines 412a and 412b for supplying a ground potential are formed in the first and fourth areas 401a and 402b to extend along their longitudinal axes, respectively. The power supply lines 411a and 411b and the ground lines 412a and 412b are parallel to one another.

Although this layout includes a lot of IGFETs arranged around the first to fourth areas 401a, 402a, 401b, and 402b, they are not shown here for the sake of simplification.

In the first area 401a, three polysilicon gate electrodes 408a, 408b, and 408c are arranged along the longitudinal axis of the area 401a at regular intervals. These gate electrodes 408a, 408b, and 408c extend vertically perpendicular to the longitudinal axis of the area 401a. The gate electrode 408c runs over the first and second areas 401a and 402a. The gate electrodes 408a and 408b run over the first area 401a only.

Two p+-type diffusion regions or source/drain regions 406a and 406b and four n+-type diffusion regions or source/drain regions 407a, 407b, 407c, and 407d are formed in the first area 401a.

The p+-type source/drain regions 406a and 406b and the corresponding gate electrode 408a constitute a p-channel MOSFET. The n+-type source/drain regions 407a and 407b and the corresponding gate electrode 408b constitute an n-channel MOSFET. The n+-type source/drain regions 407c and 407d and the corresponding gate electrode 408c constitute an n-channel MOSFET.

In the second area 402a, two polysilicon gate electrodes 408d and 408e and the common gate electrode 408c are arranged along the longitudinal axis of the area 402a at regular intervals. These gate electrodes 408d and 408e extend vertically perpendicular to the longitudinal axis of the area 402a. The gate electrodes 408d and 408e run over the second area 402a only.

Two n+-type diffusion regions or source/drain regions 407e and 407f and four p+-type diffusion regions or source/drain regions 406c, 406d, 406e, and 406f are formed in the second area 402a.

The n+-type source/drain regions 407e and 407f and the corresponding gate electrode 408d constitute an n-channel MOSFET. The p+-type source/drain regions 406c and 406d and the corresponding gate electrode 408e constitute a p-channel MOSFET. The p+-type source/drain regions 406e and 406f and the corresponding gate electrode 408c constitute a p-channel MOSFET.

In the third area 401b, five polysilicon gate electrodes 408f, 408g, 408h, 408i, and 408j are arranged along the longitudinal axis of the area 401b at regular intervals. These gate electrodes 408f, 408g, 408h, 408i, and 408j extend vertically perpendicular to the longitudinal axis of the area 401b. The four gate electrodes 408f, 408g, 408h, and 408i run over the third area 401b only. The gate electrode 408j runs over the third and fourth areas 401b and 402b.

Four n+-type diffusion regions or source/drain regions 407g, 407h, 407i and 407j and six p+-type diffusion regions or source/drain regions 406g, 406h, 406i, 406j, 406k, and 406l are formed in the third area 401b.

The n+-type source/drain regions 407g and 407h and the corresponding gate electrode 408f constitute an n-channel MOSFET. The p+-type source/drain regions 406g and 406h and the corresponding gate electrode 408g constitute a p-channel MOSFET. The p+-type source/drain regions 406i and 406j and the corresponding gate electrode 408h constitute a p-channel MOSFET. The n+-type source/drain regions 407i and 407j and the corresponding gate electrode 408i constitute an n-channel MOSFET. The p+-type source/drain regions 406k and 406l and the corresponding gate electrode 408j constitute a p-channel MOSFET.

In the fourth area 402b, five polysilicon gate electrodes 408k, 408l, 408m, 408n, and 408j are arranged along the longitudinal axis of the area 402b at regular intervals These gate electrodes 408k, 408l, 408m, 408n, and 408j extend vertically perpendicular to the longitudinal axis of the area 402b. The four gate electrodes 408k, 408l, 408m, and 408n run over the fourth area 402b only. The gate electrode 408j runs over the third and fourth areas 401b and 402b.

Four p+-type diffusion regions or source/drain regions 406m, 406n, 406o, and 406p and six n+-type diffusion regions or source/drain regions 407k, 407l, 407m, 407n, 407o, and 407p are formed in the fourth area 402b.

The p+-type source/drain regions 406m and 406n and the corresponding gate electrode 408k constitute a p-channel MOSFET. The n+-type source/drain regions 407k and 407l and the corresponding gate electrode 408l constitute an n-channel MOSFET. The n+-type source/drain regions 407m and 407, and the corresponding gate electrode 408m constitute an n-channel MOSFET. The p+-type source/drain regions 406o and 406p and the corresponding gate electrode 408n constitute a p-channel MOSET. The n⁺-type source/drain regions 407o and 407p and the corresponding gate electrode 408j constitute an n-channel MOSFET.

The p⁺-type source/drain regions 406a and 406b are electrically connected to the n⁺-type source/drain regions 407e and 407f through corresponding p-n junctions, respectively. The n⁺-type source/drain region 407a and 407b are electrically connected to the p⁺-type source/drain regions 406c and 406d through corresponding p-n junctions, respectively. The p⁺-type source/drain region 406b is electrically connected to the n⁺-type source/drain region 407a through a corresponding p-n junction. The n⁺-type source/drain region 407f is electrically connected to the p⁺-type source/drain region 406c through a corresponding p-n junction.

The n⁺-type source/drain region 407c is electrically connected to the p⁺-type source/drain region 406e through a corresponding p-n junction.

The n⁺-type source/drain regions 407g and 407h are electrically connected to the p⁺-type source/drain regions 406m and 406n through corresponding p-n junctions, respectively. The n⁺-type source/drain region 407h is electrically connected to the p⁺-type source/drain region 406g through a corresponding p-n junction. The p⁺-type source/drain regions 406g and 406h are electrically connected to the n⁺-type source/drain regions 407k and 407l through corresponding p-n junctions, respectively. The p⁺-type source/drain region 406j is electrically connected to the n⁺-type source/drain region 407i through a corresponding p-n junction. The p⁺-type source/drain regions 406i and 406j are electrically connected to the n⁺-type source/drain regions 407m and 407n through corresponding p-n junctions, respectively. The p⁺-type source/drain region 406n is electrically connected to the n⁺-type source/drain region 407k through a corresponding p-n junction. The n⁺-type source/drain regions 407i and 407j are electrically connected to the p⁺-type source/drain regions 406o and 406p through corresponding p-n junctions, respectively. The n⁺-type source/drain region 407n is electrically connected to the p⁺-type source/drain region 406o through a corresponding p-n junction.

The p⁺-type source/drain region 406k is electrically connected to the n⁺-type source/drain region 407o through a corresponding p-n junction.

The neighborhood of each p-n junction of the adjoining p⁺- and n⁺-type source/drain regions serves as an interconnection diffusion region.

A metal wiring line 420 is connected to the n⁺-type source/drain regions 407m in the fourth area 402b. The wiring line 420 is electrically connected to an input terminal (not shown) of the 4-1 selector circuit in FIG. 15, to which a first input signal A0 is applied.

A metal wiring line 421 is connected to the p⁺-type source/drain regions 406p in the fourth area 402b. The wiring line 421 is electrically connected to an input terminal (not shown) of the 4-1 selector circuit in FIG. 15, to which a second input signal A1 is applied.

A metal wiring line 422 is connected to the n⁺-type source/drain regions 407l in the fourth area 402b. The wiring line 422 is electrically connected to an input terminal (not shown) of the 4-1 selector circuit in FIG. 15, to which a third input signal A2 is applied.

A metal wiring line 423 is connected to the p⁺-type source/drain region 406m in the fourth area 402b. The wiring line 423 is electrically connected to an input terminal (not shown) of the 4-1 selector circuit in FIG. 15, to which a fourth input signal A3 is applied.

A metal wiring line 424 is connected to the gate electrodes 408f, 408g, 408h, 408i, and 408j in the third area 401b. The wiring line 424 is electrically connected to an input terminal (not shown) of the 4-1 selector circuit in FIG. 15, to which a first select signal S0 is applied.

A metal wiring line 425 is connected to the gate electrodes 408d, 408e, and 408c in the second area 402a. The wiring line 425 is electrically connected to an input terminal (not shown) of the 4-1 selector circuit in FIG. 15, to which a second select: signal S1 is applied.

A metal wiring line 426 is connected to the p⁺- and n⁺-type source/drain regions 406b and 407a in the first area 401a. The wiring line 426 is electrically connected to an output terminal (not shown) of the 4-1 selector circuit in FIG. 15, from which an output signal X is derived.

A metal wiring line 414 is connected to the gate electrodes 408k, 408l, 408m, and 408n in the fourth area 402b. The wiring line 414 electrically interconnects these gate electrodes 408k, 408l, 408m and 408n to one another.

A metal wiring line 415 is connected to the gate electrodes 408a and 408b and n⁺-type source/drain region 407c in the first area 401a. The wiring line 415 electrically interconnects these gate electrodes 408a and 408b, and the n⁺-type source/drain region 407c to one another.

The p- and n-channel MOSFETs using the gate electrodes 408j and 408c, to which the metal wiring lines 424 and 425 for the first and second select signals S0 and S1 are respectively connected, constitute CMOS inverters 509a and 509b in FIG. 15, respectively.

The two p-channel MOSFETs using the gate electrodes 408h and 408n and the two n-channel MOSFETs using the gate electrodes 408i and 408m constitute CMOS transfer gates 508a and 508b in FIG. 15, respectively. The first and second input signals A0 and A1 are applied to the transfer gates 508a and 508b, respectively. Each of the CMOS transfer gates 508a and 508b serves as the 2-1 selector circuit shown in FIG. 6.

The two p-channel MOSFETs using the gate electrodes 408g and 408k and the two n-channel MOSFETs using the gate electrodes 408f and 408l constitute CMOS transfer gates 508c and 508d in FIG. 15, respectively. The third and fourth input signals A2 and A3 are applied to the transfer gates 508c and 508d, respectively. Each of the CMOS transfer gates 508c and 508d serves as the 2-1 selector circuit shown in FIG. 6.

The two p-channel MOSFETs using the gate electrodes 408a and 408e and the two n-channel MOSFETs using the gate electrodes 408b and 408d constitute CMOS transfer gates 508e and 508f in FIG. 15, respectively. The output signals of the two 2-1 circuits are applied to the transfer gates 508e and 508f, respectively. Each of the CMOS transfer gates 508e and 508f serves as the 2-1 selector circuit shown in FIG. 6.

Figure 16:
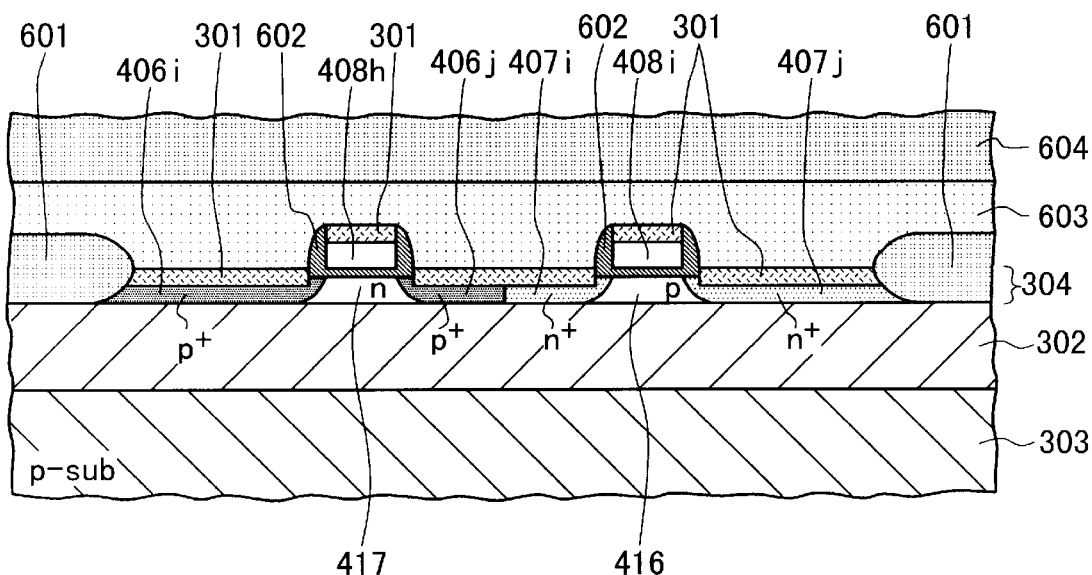
FIG. 16 shows a cross-section along the line XVI—XVI in FIG. 14.
Figure 17:
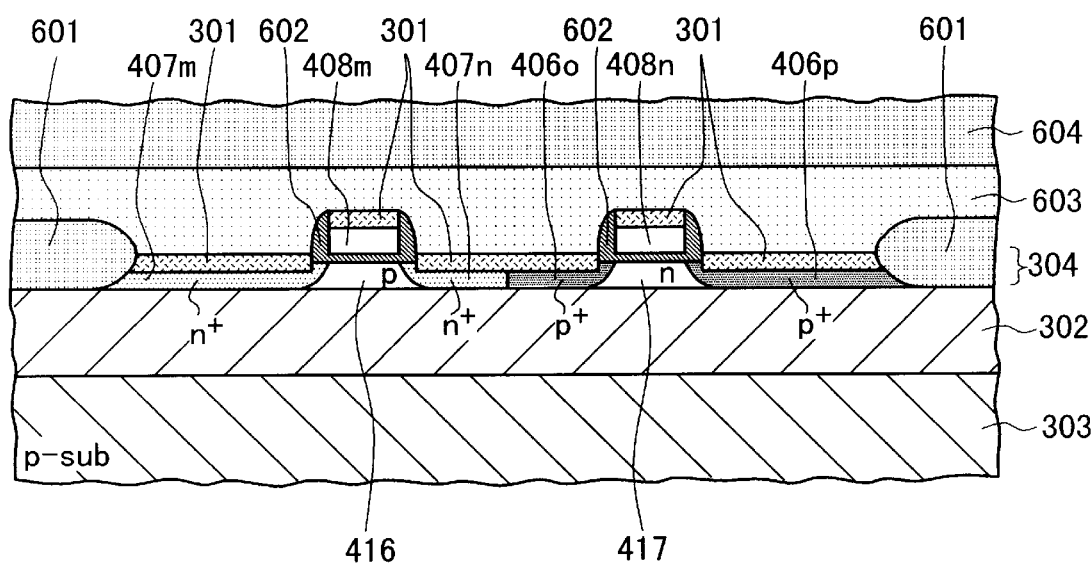
FIG. 17 shows a cross-section along the line XVII—XVII in FIG. 14.

As shown in FIGS. 16 and 17, this SOG array according to the second embodiment has substantially the same cross section as that of the first embodiment. Therefore, the explanation about the cross section is omitted here by attaching the same reference numerals to the same and corresponding elements in FIG. 11.

With the CMOS SOG array according to the second embodiment, because t:he p- and n-channel MOSFETs are electrically connected by the interconnection diffusion regions, the number of the metal wiring lines is decreased to eight excluding the power supply and ground lines. This reduces the chip area of the metal wiring lines and raises the integration level or density.

Although the 4-1 selector circuit is implemented in the second embodiment, any one of (2n−1)-1 selector circuits may be implemented, where n is a natural number.

Third Embodiment

Figure 18:
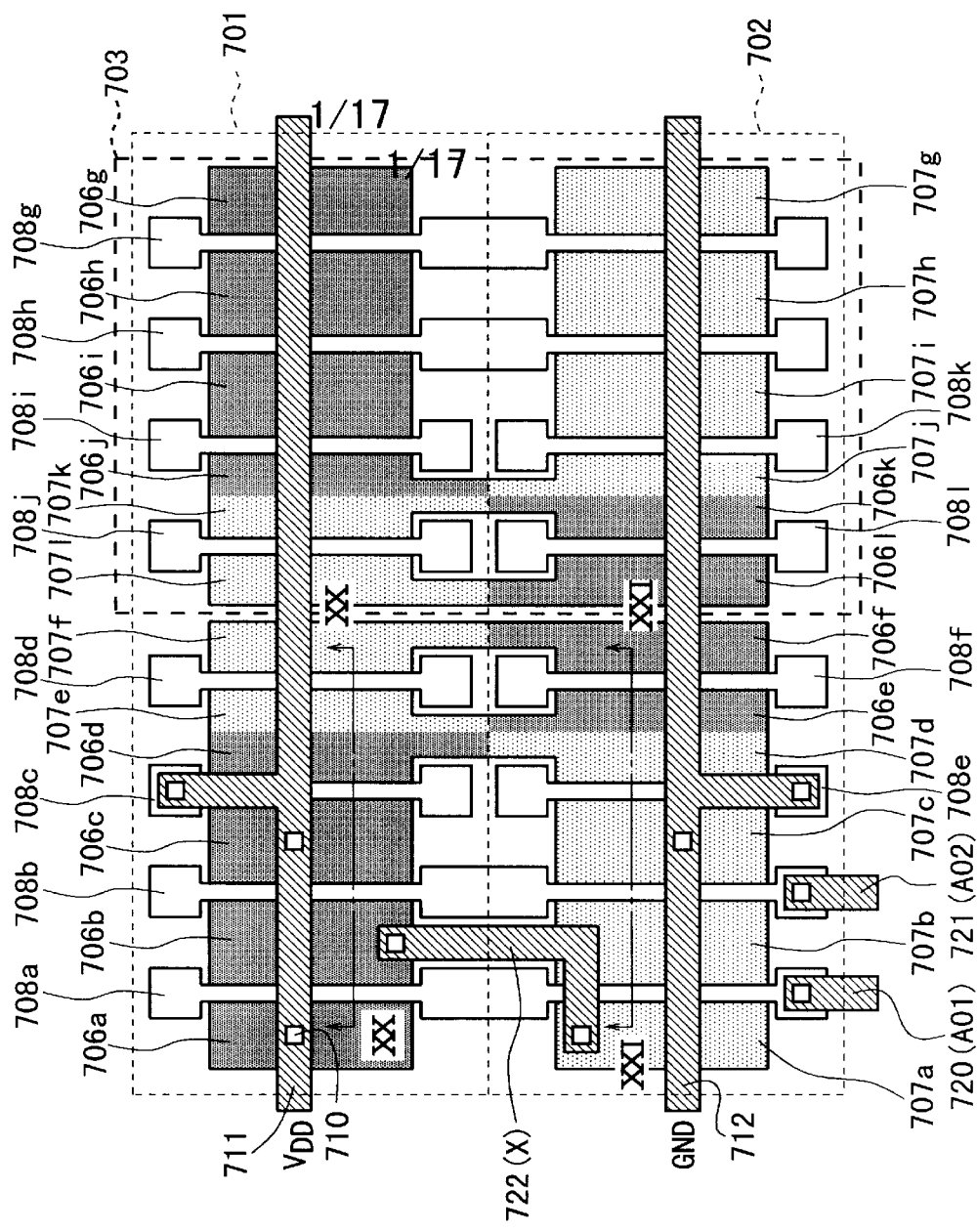
FIG. 18 shows a layout of a CMOS SOG array according to a third embodiment of the present invention, which includes a logic block of a two-input NAND circuit shown in FIG. 19.
Figure 19:
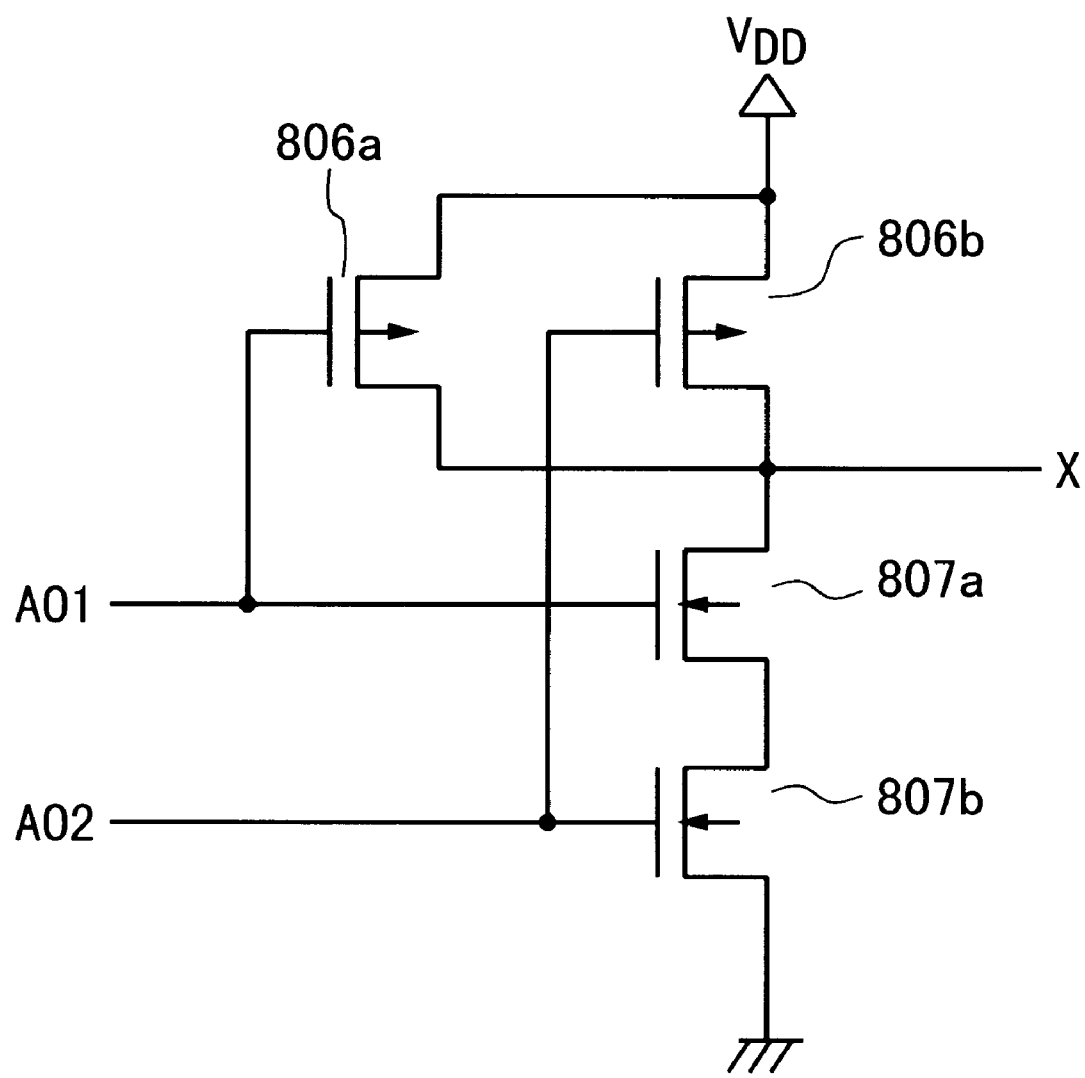
FIG. 19 is a block diagram of a two-input NAND circuit.

FIGS. 18 to 21 show a CMOS SOG array according to a third embodiment, which includes a logic block of a two-input NAND circuit shown in FIG. 19.

As shown in FIG. 18, a first rectangular area 701 and a second rectangular area 702 are formed to be contacted with each other at their interface or boundary, forming a unit cell. These areas 701 and 702 are electrically connected at the interface or boundary. No isolation area is located between the areas 701 and 702.

This layout is formed by two basic cells 703, one of which forms a mirror image of the other with respect to the vertical center line of the layout.

Although this layout includes a lot of IGFETs arranged around the first and second areas 701 and 702, they are not shown here for the sake of simplification.

A power supply line 711 for supplying a voltage $V_{DD}$ is formed in the first area 701 to extend along its longitudinal axis. A ground line 712 for supplying a ground potential is formed in the second area 702 to extend along its longitudinal axis. The power supply line 711 and the ground line 712 are parallel to one another.

In the first area 701, eight polysilicon gate electrodes 708a, 708b, 708c, 708d, 708g, 708h, 708i, and 708j are arranged along the Longitudinal axis of the area 701 at regular intervals. These gate electrodes 708a, 708b, 708c, 708d, 708g, 708h, 708i, and 708j extend vertically perpendicular to the longitudinal axis of the area 701. The four gate electrode 708a, 708b, 708g, and 708h runs over the first and second areas 701 and 702. The gate electrodes 708c, 708d, 708e, 708f, 708i, 708j, 708k, and 708l run over the first area 701 only.

Eight p+-type diffusion regions or source/drain regions 706a, 706b, 706c, 706d, 706g, 706h, 706i, and 706j and four n+-type diffusion regions or source/drain regions 707e, 707f, 707k, and 707l are arranged at regular intervals in the first area 701 along its longitudinal axis.

The p+-type source/drain regions 706a and 706b and the corresponding gate electrode 708a constitute a p-channel MOSFET. The p+-type source/drain regions 706b and 706c and the corresponding gate electrode 708b constitute a p-channel MOSFET. The p+-type source/drain regions 706c and 706d and the corresponding gate electrode 708c constitute a p-channel MOSFET. The n+-type source/drain regions 707e and 707f and the corresponding gate electrode 708d constitute an n-channel MOSFET. The n+-type source/drain regions 707k and 707l and the corresponding gate electrode 708j constitute an n-channel MOSFET. The p+-type source/drain regions 706g and 706h and the corresponding gate electrode 708g constitute a p-channel MOSFET. The p+-type source/drain regions 706h and 706i and the corresponding gate electrode 708h constitute a p-channel MOSFET. The p+-type source/drain regions 706i and 706j and the corresponding gate electrode 708i constitute a p-channel MOSFET.

In the second area 702, eight polysilicon gate electrodes 708a, 708b, 708e, 708f, 708g, 708h, 708k, and 708l are arranged along the longitudinal axis of the area 701 at regular intervals. These gate electrodes 708a, 708b, 708e, 708f, 708g, 708h, 708k, and 708l extend vertically perpendicular to the longitudinal axis of the area 702. The four gate electrode 708e 708f, 708k, and 708l runs over the first and second areas 701 and 702. The gate electrodes 708e, 708f, 70ke, and 708l run over the second area 702 only.

Eight n+-type diffusion regions or source/drain regions 707a, 707b, 707c, 707d, 707g, 707h, 707i, and 707j and four p+-type diffusion regions or source/drain regions 706e, 706f, 706k, and 706l are arranged at regular intervals in the second area 702 along its longitudinal axis.

The n+-type source/drain regions 707a and 707b and the corresponding gate electrode 708a constitute an n-channel MOSFET. The n+-type source/drain regions 707b and 707c and the corresponding gate electrode 708b constitute an n-channel MOSFET. The n+-type source/drain regions 707c and 707d and the corresponding gate electrode 708e constitute an n-channel MOSFET. The p+-type source/drain regions 706e and 706f and the corresponding gate electrode 708f constitute a p-channel MOSFET. The p+-type source/drain regions 706k and 701l and the corresponding gate electrode 708l constitute a p-channel MOSFET. The n+-type source/drain regions 707g and 707h and the corresponding gate electrode 708g constitute an n-channel MOSFET. The n+-type source/drain regions 707h and 707i and the corresponding gate electrode 708h constitute an n-channel MOSFET. The p+-type source/drain regions 706i and 706j and the corresponding gate electrode 708i constitute an n-channel MOSFET.

The n+-type source/drain region 707e and 707f are electrically connected to the p+-type source/drain regions 706e and 706f through corresponding p-n junctions, respectively. The n+-type source/drain region 707k and 707l are electrically connected to the p+-type source/drain regions 706k and 706l through corresponding p-n junctions, respectively. The n+-type source/drain region 707e is electrically connected to the p+-type source/drain region 706d through a corresponding p-n junction. The n+-type source/drain region 707k is electrically connected to the p+-type source/drain region 706k through a corresponding p-n junction.

The neighborhood of each p-n junction of the adjoining p+- and n+-type source/drain regions serves as an interconnection diffusion region.

A metal wiring line 720 is connected to the gate electrode 708a in the second area 702. The wiring line 720 is electrically connected to an input terminal (not shown) of the two-input NAND circuit in FIG. 19, to which a first input signal A0 is applied.

A metal wiring line 721 is connected to the gate electrode 708a in the second area 702. The wiring line 721 is electrically connected to an input terminal (not shown) of the two-input NAND circuit in FIG. 19, to which a second input signal A1 is applied.

A metal wiring line 722 is formed to interconnect the p+- and n+-type source/drain regions 706b and 707a. The wiring line 722 is electrically connected to an output terminal (not shown) of the two-input NAND circuit in FIG. 19, from which an output signal X is derived.

The power supply voltage $V_{DD}$ is applied to the p+-type source/drain regions 706a and 706c. The ground voltage is applied to the n+-type source/drain region 707c.

Additionally, to keep the p- and n-channel MOSFETs using the gate electrodes 708c and 708e non-conductive, the power supply and ground voltages are applied to the gate electrodes 708c and 708e, respectively.

The p- and n-channel MOSFETs 806a and 807a in FIG. 19 are formed by the p- and n-channel MOSFETs using the common gate electrodes 708a, respectively. The p- and n-channel MOSFETs 806b and 807b in FIG. 19 are formed by the p- and n-channel MOSFETs using the common gate electrodes 708b, respectively. Thus, the two-input NAND circuit in FIG. 19 is constituted. The remaining MOSFETs are not used here.

Figure 20:
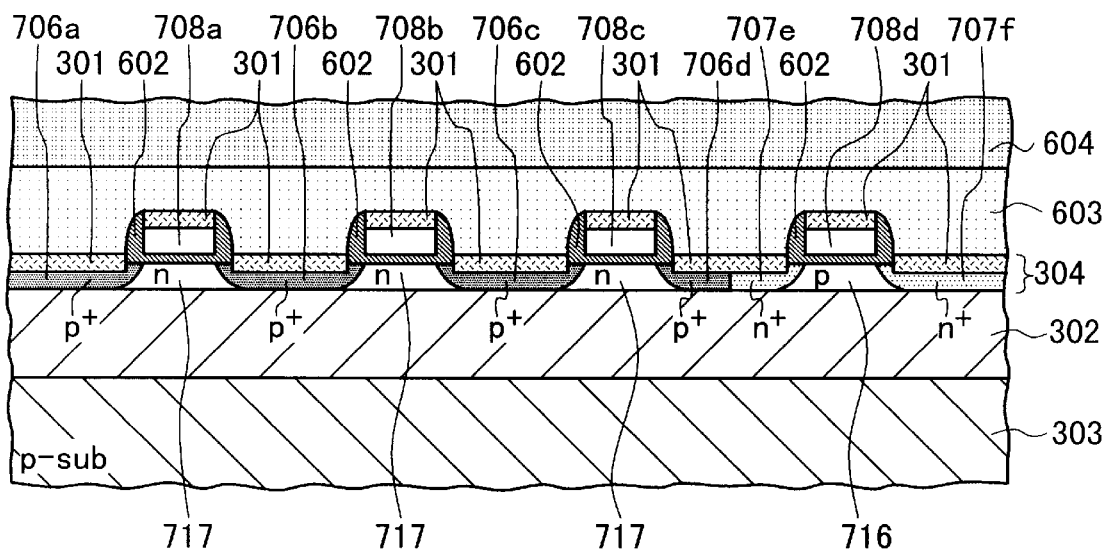
FIG. 20 shows a cross-section along the line XX—XX in FIG. 18.
Figure 21:
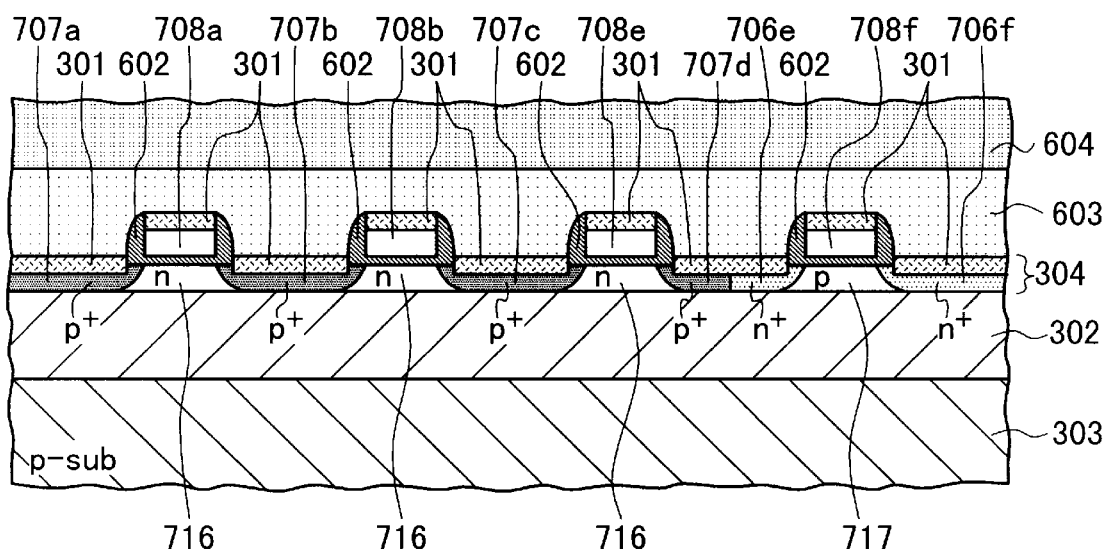
FIG. 21 shows a cross-section along the line XXI—XXI in FIG. 18.

As shown in FIGS. 20 and 21, this array according to the third embodiment has substantially the same cross section as that of the first embodiment. Therefore, the explanation about the cross section is omitted here by attaching the same reference numerals to the same and corresponding elements in FIGS. 20 and 21.

With the CMOS SOG array according to the third embodiment, because of the same reason as that in the first embodiment, the number of the metal wiring lines is decreased to three excluding the power supply and ground lines 711 and 712. This reduces the chip area of the metal wiring lines and raises the integration level or density.

Fourth Embodiment

Figure 22:
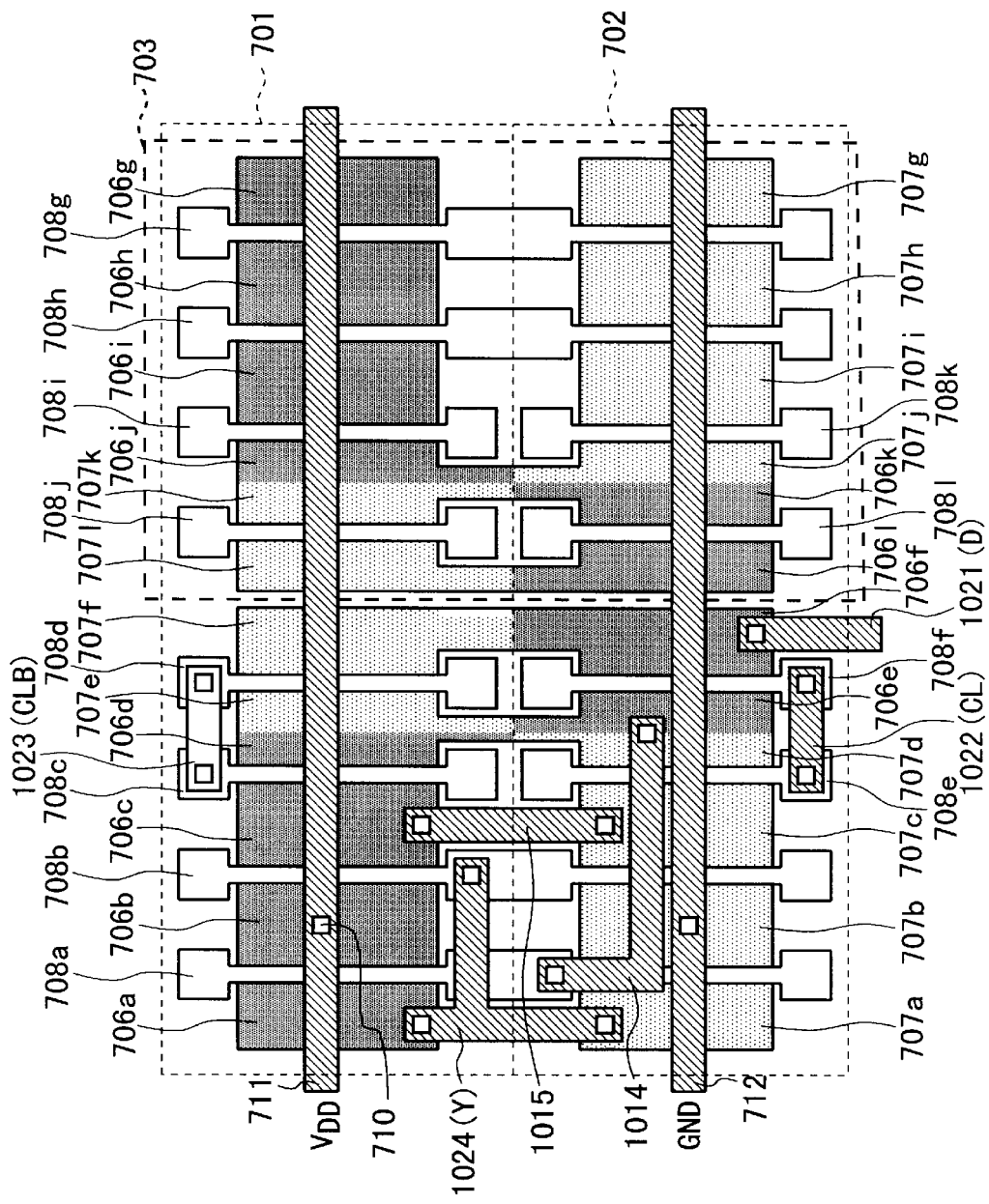
FIG. 22 shows a layout of a CMOS SOG array according to a fourth embodiment of the present invention, which includes a logic block of a latch circuit shown in FIG. 23.
Figure 23:
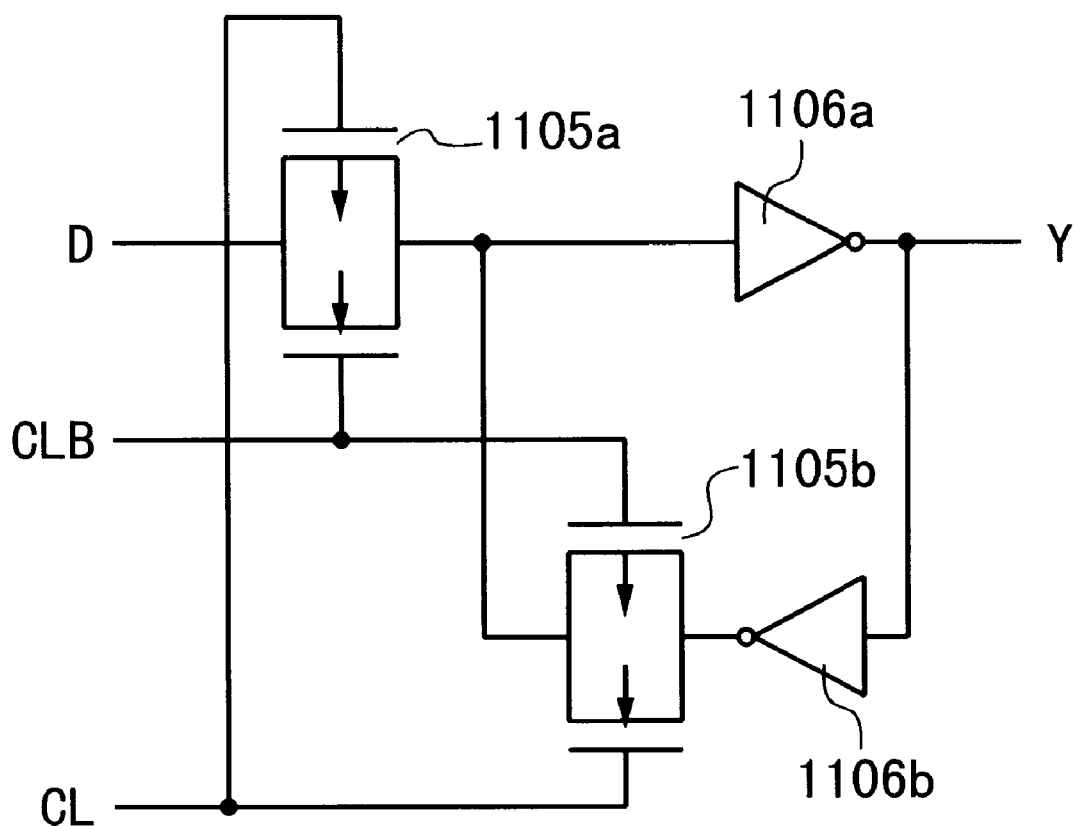
FIG. 23 is a block diagram of a latch circuit.

FIGS. 22 and 23 show a CMOS SOG array according to a fourth embodiment, in Which the two basic cells 703 shown in the third embodiment are used and a latch circuit shown in FIG. 23 is implemented.

As shown in FIG. 22, this array according to the fourth embodiment has substantially the same layout and cross section as those of the third embodiment excluding the pattern of metal wiring lines. Therefore, the explanation about the same configuration is omitted here by attaching the same reference numerals to the same and corresponding elements in FIG. 22.

In FIG. 22, the power supply voltage $V_{DD}$ is applied to the $p^+$-type source/drain region 706b in the first area 701, and the ground line is applied to the $n^+$-type source/drain region 707b in the second area 702.

A metal wiring line 1021 is connected to the $n^+$-type source/drain region 706f in the second area 702. The wiring line 1021 is electrically connected to an input terminal (not shown) of the latch circuit in FIG. 23, to which a data signal D is applied.

A metal wiring line 1022 interconnects the gate electrodes 708e and 708f in the second area 702. The wiring line 1022 is electrically connected to an input terminal (not shown) of the latch circuit in FIG. 23, to which a clock signal CL is applied.

A metal wiring line 1023 interconnects the gate electrodes 708c and 708d in the first area 701. The wiring line 1023 is electrically connected to an input terminal (not shown) of the latch circuit in FIG. 23, to which another clock signal CLB is applied.

A metal wiring line 1024 interconnects the p- and $n^+$-type source/drain regions 706a and 707a and the gate electrode 708b. The wiring line 1024 is electrically connected to an output terminal (not shown) of the latch circuit in FIG. 23, fron which an output signal Y is derived.

A metal wiring line 1014 interconnects the p- and $n^+$-type source/drain regions 706e and 707d and the gate electrode 708a.

A metal wiring line 1015 interconnects the p- and $n^+$-type source/drain regions 706c and 707c.

The CMOS inverters 1106a and 1106b in FIG. 23 are formed by the p- and n-channel MOSFETs using the common gate electrodes 708a and the p- and n-channel MOSFETs using the common gate electrodes 708b, respectively. The CMOS transfer gates 1105a and 1105b in FIG. 23 are formed by the two p-channel MOSFETs and the two n-channel MOSFETs using the gate electrodes 708c, 708d, 708e, and 708f, respectively.

Thus, the latch circuit shown in FIG. 23 is implemented using one of the two basic cells 703 in FIG. 22.

If two latch circuits with the configuration as shown in FIG. 23 are formed in the two basic cells 703, respectively, and these two latch circuits are serially connected to one another, a flip-flop circuit of a master-slave type may be constituted.

With the CMOS SOG array according to the fourth embodiment, because of the same reason as that in the first embodiment, the number of the metal wiring lines is decreased to three excluding the power supply and ground lines 711 and 712. This reduces the chip area of the metal wiring lines and raises the integration level or density.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A semiconductor integrated circuit device comprising:
   (a) a semiconductor layer formed on an insulating substrate;
   said semiconductor layer having first area extending along a first direction and a second area extending along said first direction;
   said first and second areas being adjacent to one another;
   (b) a first IGFET of a first conductivity type formed in said first area of said semiconductor layer;
   said first IGFET having a first pair of source/drain regions;
   (c) a second IGFET of a second conductivity type opposite to said first conductivity type formed in said first area of said semiconductor layer;
   said second IGFET having a second pair of source/drain regions;
   one of said second pair of source/drain regions being electrically connected to one of said first pair of source/drain regions by a first interconnection diffusion region; and
   (d) a third IGFET of said first conductivity type formed in said second area of said semiconductor layer;
   said third IGFET having a third pair of source/drain regions;
   one of said third pair of source/drain regions being electrically connected to one of said second pair of source/drain regions by a second interconnection diffusion region.

2. A device as claimed in claim 1, wherein said first interconnection diffusion region is formed by at least one of said one of said first pair of source/drain regions and said one of said second pair of source/drain regions, and said second interconnection diffusion region is formed by at least one of said one of said second pair of source/drain regions and said one of said third pair of source/drain regions.

3. A device as claimed in claim 1, further comprising;
   a first power supply line for supplying a first electric potential formed to be overlapped with said first area; and
   a second power supply line for supplying a second electric potential formed to be overlapped with said second area;
   wherein said first and second power supply lines extend along said first direction of said first and second areas.

4. A device as claimed in claim 1, wherein said first, second, and third IGFETs have first, second, and third gate electrodes extending along a second direction perpendicular to said first direction, respectively;

and wherein said second and third gate electrodes are separated from each other and located on a same line.

5. A device as claimed in claim 1, further comprising a fourth IGFET of said second conductivity type formed in said second area;

wherein said fourth IGFET has a fourth pair of source/drain regions;

and wherein one of said fourth pair of source/drain regions is electrically connected to one of said third pair of source/drain regions which is not electrically connected to said second interconnection diffusion region.

6. A device as claimed in claim 1, further comprising first and second unit cells;

wherein each of said first and second unit cells includes said first, second, and third IGFETs and said first and second interconnection diffusion regions;

and wherein said first and second unit cells are arranged so that said second unit cell forms a mirror image of said first cell.

7. A semiconductor integrated circuit device comprising:

(a) a semiconductor layer formed on an insulating substrate;

(b) a first plurality of IGFETs of a first conductivity type; and (c) a second plurality of IGFETs of a second conductivity type opposite to said first conductivity type;

wherein said semiconductor layer has a first area extending along a first direction and a second area extending along said first direction, said first and second areas being adjacent to one another;

and wherein one of said first plurality of IGFETs is located in said second area of said semiconductor layer, while said remaining first plurality of IGFETs are regularly arranged in said first area;

and wherein one of said second plurality of IGFETs is located in said first area of said semiconductor layer, while said remaining second plurality of IGFETs are regularly arranged in said second area;

and wherein said one of said first plurality of IGFETs located in said second area has a pair of source/drain regions, one of which is electrically connected to one of a pair of source/drain regions of an adjoining one of said remaining second plurality of IGFETs by a first interconnection diffusion region;

and wherein said one of said second plurality of IGFETs located in said first area has a pair of source/drain regions, one of which is electrically connected to one of a pair of source/drain regions of an adjoining one of said remaining first plurality of IGFETs by a second interconnection diffusion region;

and wherein said pair of source/drain regions of said one of said first plurality of IGFETs located in said second area is electrically connected to said pair of source/drain regions of said one of said second plurality of IGFETs located in said first area by third and fourth interconnection diffusion regions, respectively.

8. A device as claimed in claim 7, further comprising:

a first power supply line for supplying a first electric potential formed to be overlapped with said first area; and a second power supply line for supplying a second electric potential formed to be overlapped with said second area;

wherein said first and second power supply lines extend along said first direction of said first and second areas.

9. A device as claimed in claim 7, wherein said one of said first plurality of IGFETs located in said second area and said one of said second plurality of IGFETs located in said first area have first and second gate electrodes extending along a second direction perpendicular to said first direction, respectively;

and wherein said first and second gate electrodes are separated from each other and located on a same line.

10. A device as claimed. in claim 7, further comprising first and second unit cells;

wherein each of said first and second unit cells includes said one of said first plurality of IGFETs located in said second area and said one of said second plurality of IGFETs located in said first area;

and wherein said first and second unit cells are arranged so that said second unit cell forms a mirror image of said first cell.

* * * * *

UNITED STATES PATENT AND TRADEMARK OFFICE
CERTIFICATE OF CORRECTION

PATENT NO.: 6,037,617
DATED: March 14, 2000
INVENTOR(S): Kouichi KUMAGAI

It is certified that error(s) appears in the above-identified patent and that said Letters Patent is hereby corrected as shown below:

Column 11, line 41 delete "10h" insert --108h--
Column 12, line 2 delete "ne" insert --$n^+$--
        line 12 delete "he" insert --the--
Column 16, line 36 delete "4061I" insert --4061--
Column 20, line 3 delete "70Ke" insert --708K--

Signed and Sealed this

Third Day of April, 2001

Attest:

NICHOLAS P. GODICI

Attesting Officer     Acting Director of the United States Patent and Trademark Office